(12) United States Patent
Ito et al.

(10) Patent No.: US 11,315,820 B2
(45) Date of Patent: Apr. 26, 2022

(54) SUBSTRATE PROCESSING DEVICE AND SUBSTRATE PROCESSING METHOD

(71) Applicant: SCREEN Holdings Co., Ltd., Kyoto (JP)

(72) Inventors: Tetsuo Ito, Kyoto (JP); Noriyuki Kikumoto, Kyoto (JP); Kazuki Inoue, Kyoto (JP); Kunio Yamada, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 95 days.

(21) Appl. No.: 16/801,193

(22) Filed: Feb. 26, 2020

(65) Prior Publication Data
US 2020/0312697 A1   Oct. 1, 2020

(30) Foreign Application Priority Data

Mar. 28, 2019   (JP) .............................. JP2019-063854

(51) Int. Cl.
*H01L 21/683*   (2006.01)
*H01L 21/67*   (2006.01)
*H01L 21/02*   (2006.01)

(52) U.S. Cl.
CPC ...... *H01L 21/6835* (2013.01); *H01L 21/6715* (2013.01); *H01L 21/67051* (2013.01); *H01L 21/02112* (2013.01)

(58) Field of Classification Search
None
See application file for complete search history.

(56) References Cited

U.S. PATENT DOCUMENTS

| | | | |
|---|---|---|---|
| 10,115,610 B2 | 10/2018 | Yagi | |
| 10,818,521 B2 * | 10/2020 | Miyahara | .......... H01L 21/67046 |
| 2004/0105738 A1 | 6/2004 | Ahn et al. | |
| 2014/0137893 A1 * | 5/2014 | Otsuka | .............. H01L 21/02041 |
| | | | 134/18 |
| 2015/0234296 A1 | 8/2015 | Yagi | |
| 2016/0240401 A1 | 8/2016 | Muramoto et al. | |
| 2018/0261475 A1 | 9/2018 | Muramoto et al. | |

FOREIGN PATENT DOCUMENTS

| | | |
|---|---|---|
| JP | 2014103263 | 6/2014 |
| JP | 2015153947 | 8/2015 |
| JP | 2016149461 | 8/2016 |
| JP | 2018019093 | 2/2018 |
| JP | 6442018 | 12/2018 |
| KR | 20100055681 | 5/2010 |

* cited by examiner

*Primary Examiner* — Dung A. Le
(74) *Attorney, Agent, or Firm* — JCIPRNET

(57) ABSTRACT

A substrate processing device is provided. A chamber has a side wall part and a top wall part and contains a substrate holding part. A first gas supply part is disposed in the top wall part and supplies a first gas toward a side on which the substrate holding part is positioned. A second gas supply part is contained in the chamber and supplies a second gas to an inside of the chamber. A control unit controls the first and second gas supply part. The second gas is a gas different from oxygen and an allotrope of oxygen. The second gas supply part has an air feeding port part which is positioned on an upward side of a holding position of a substrate by the substrate holding part in a vertical direction and is positioned on an outward side of the substrate holding part in a horizontal direction.

16 Claims, 14 Drawing Sheets

SUBSTRATE PROCESSING DEVICE AND SUBSTRATE PROCESSING METHOD

CROSS-REFERENCE TO RELATED APPLICATION

This application claims priority based on Japanese Patent Application No. 2019-063854, filed on Mar. 28, 2019, based on Article 119 of US Patent Law, and all the contents described in the Japanese priority application are incorporated herein by reference.

BACKGROUND

Technical Field

The disclosure relates to a substrate processing device, a substrate processing method, and a semiconductor manufacturing method.

Description of Related Art

In the substrate processing device disclosed in a patent document (Japanese Patent Laid-Open No. 2015-153947), oxidation of a substrate at a time of processing the substrate inside a chamber is curbed.

Specifically, a substrate is disposed above a spin base. A facing surface of a blocking member is disposed above the substrate. An inner circumferential surface of the blocking member is disposed around the substrate. Further, an inert gas is ejected downward from a downward ejection port which opens on the facing surface of the blocking member. The inert gas ejected through the downward ejection port of the blocking member diffuses into a space between an upper surface of the substrate and the facing surface of the blocking member and is discharged from between a lower end of the inner circumferential surface of the blocking member and an outer circumferential surface of the spin base. Since a space between the substrate and the blocking member is filled with the inert gas, an oxygen concentration in an atmosphere contact with the upper surface of the substrate and the outer circumferential surface is decreased.

In addition, movement of an atmosphere including oxygen between the upper surface of the substrate and the facing surface of the blocking member can be curbed by ejecting an inert gas through an upward ejection port of the spin base in a state where the inert gas is being ejected through the downward ejection port of the blocking member. As a result, the oxygen concentration in the atmosphere contact with a substrate W can be decreased.

Moreover, in a state where an inert gas is being ejected through the upward ejection port of the spin base, a substrate is placed on a chuck pin by a center robot. While the substrate approaches the chuck pin, the inert gas ejected through the upward ejection port of the spin base diffuses between the substrate and the spin base and discharges an atmosphere including oxygen. Since an atmosphere including oxygen is discharged in advance, movement of an atmosphere including oxygen from between the substrate and the spin base to a space between the substrate and the blocking member can be curbed.

However, recently, there has been a demand for further curbed oxidation of a substrate. Therefore, the inventor of this application has focused on a possibility of oxidation of a substrate at the time of conveying the substrate inside a chamber.

SUMMARY

The disclosure provides a substrate processing device, a substrate processing method, and a semiconductor manufacturing method, in which oxidation of a substrate at a time of conveying the substrate inside a chamber can be curbed.

According to an aspect of the disclosure, a substrate processing device performs processing of a substrate. The substrate processing device includes a substrate holding part, a chamber, a first gas supply part, a second gas supply part, and a control unit. The substrate holding part holds the substrate. The chamber has a side wall part disposed around the substrate holding part and a top wall part disposed above the substrate holding part and contains the substrate holding part. The first gas supply part is disposed in the top wall part and supplies a first gas toward a side on which the substrate holding part is positioned. The second gas supply part is contained in the chamber and supplies a second gas to an inside of the chamber. The control unit controls the first gas supply part and the second gas supply part. The second gas is a gas different from oxygen and different from an allotrope of oxygen. The second gas supply part has an air feeding port part for supplying the second gas to the inside of the chamber. The air feeding port part is positioned on an upward side of a holding position of the substrate by the substrate holding part in a vertical direction and is positioned on an outward side of the substrate holding part in a horizontal direction.

According to another aspect of the disclosure, there is provided a substrate processing method in which a substrate held by a substrate holding part inside a chamber is processed. The substrate processing method includes a step of supplying a first gas from a top wall part of the chamber toward a side on which the substrate holding part surrounded by a side wall part of the chamber is positioned, and a step of supplying a second gas to an inside of the chamber during a period different from a period of executing the step of supplying the first gas. The second gas is a gas different from oxygen and different from an allotrope of oxygen. In the step of supplying the second gas, the second gas is supplied from a position on an upward side of a holding position of the substrate by the substrate holding part in a vertical direction and a position on an outward side of the substrate holding part in a horizontal direction.

According to still another aspect of the disclosure, there is provided a semiconductor manufacturing method in which a semiconductor substrate held by a substrate holding part inside a chamber is processed and a semiconductor that is the processed semiconductor substrate is manufactured. The semiconductor manufacturing method includes a step of supplying a first gas from a top wall part of the chamber toward a side on which the substrate holding part surrounded by a side wall part of the chamber is positioned, and a step of supplying a second gas to an inside of the chamber during a period different from a period of executing the step of supplying the first gas. The second gas is a gas different from oxygen and different from an allotrope of oxygen. In the step of supplying the second gas, the second gas is supplied from a position on an upward side of a holding position of the semiconductor substrate by the substrate holding part in a vertical direction and a position on an outward side of the substrate holding part in a horizontal direction.

BRIEF DESCRIPTION OF THE DRAWINGS

FIG. 6 is a flowchart showing oxygen concentration decreasing processing shown in FIG. 4 before a substrate is carried in.

FIG. 13 is a flowchart showing oxygen concentration decreasing processing shown in FIG. 11 before a substrate is carried in.

DESCRIPTION OF THE EMBODIMENTS

Figure 1:
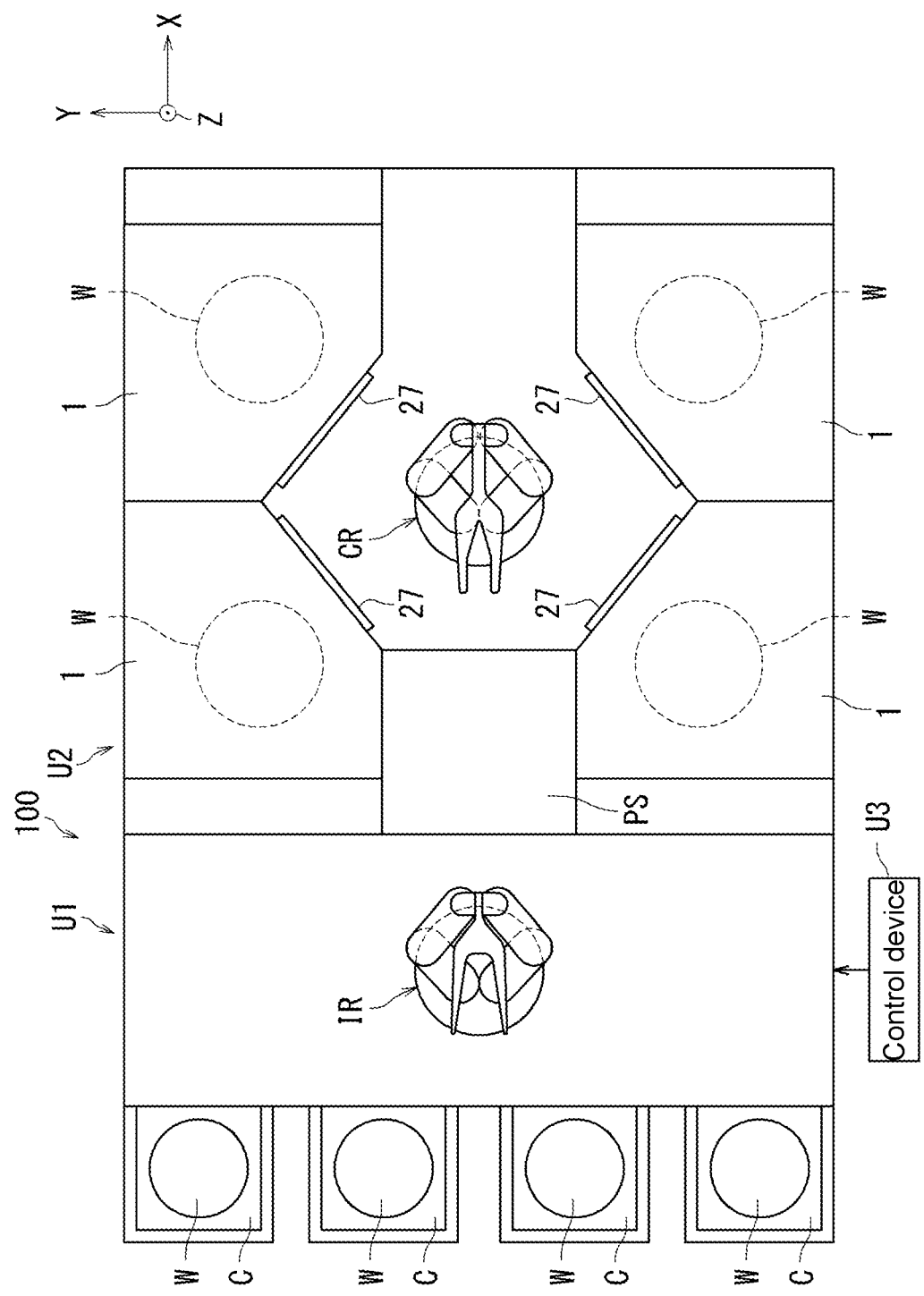
FIG. 1 is a schematic plan view showing a substrate processing device according to Embodiment 1 of the disclosure.

Hereinafter, embodiments of the disclosure will be described with reference to the drawings. In the diagrams, the same reference signs are applied to parts which are the same or corresponding, and description thereof will not be repeated. In addition, in the embodiments of the disclosure, an X-axis, a Y-axis, and a Z-axis are orthogonal to each other. The X-axis and the Y-axis are parallel to a horizontal direction. The Z-axis is parallel to a vertical direction. In addition, "a plan view" indicates that an object is viewed in the vertical direction. For the sake of simplification of the drawings, oblique lines indicating a cross section will be suitably omitted in the drawings.

Embodiment 1

With reference to FIGS. 1 to 7, a substrate processing device 100 according to Embodiment 1 of the disclosure will be described. The substrate processing device 100 performs processing of a substrate W. For example, the substrate W is a semiconductor wafer, a substrate for a liquid crystal display device, a substrate for a plasma display, a substrate for a field emission display (FED), a substrate for an optical disc, a substrate for a magnetic disk, a substrate for a magneto-optical disk, a substrate for a photomask, a ceramic substrate, or a substrate for a solar battery. For example, the substrate W has a substantially circular plate shape.

First, the substrate processing device 100 will be described with reference to FIG. 1. FIG. 1 is a schematic plan view showing the substrate processing device 100. As shown in FIG. 1, the substrate processing device 100 includes an indexer unit U1, a processing unit U2, and a control device U3. The control device U3 controls the indexer unit U1 and the processing unit U2. For example, the control device U3 is a computer. The indexer unit U1 includes a plurality of substrate containers C and an indexer robot IR. The processing unit U2 includes a plurality of processing devices 1, a conveyance robot CR, and a reception/delivery part PS. The processing unit U2 may include one processing device 1.

Each of the substrate containers C contains a plurality of substrates W in a layered manner. The indexer robot IR takes out an unprocessed substrate W from any substrate container C of the plurality of substrate containers C and delivers the substrate W to the reception/delivery part PS. Further, the substrate W taken out from the substrate container C is placed in the reception/delivery part PS. The conveyance robot CR receives the unprocessed substrate W from the reception/delivery part PS and carries the substrate W into any processing device 1 of the plurality of processing devices 1.

Further, the processing device 1 performs processing of the unprocessed substrate W. The processing device 1 is a single wafer processing device for processing the substrates W one by one. In Embodiment 1, the processing device 1 performs processing of the substrate W using a processing liquid.

After processing by the processing device 1, the conveyance robot CR takes out the processed substrate W from the processing device 1 and delivers the substrate W to the reception/delivery part PS. Further, the substrate W processed in the processing device 1 is placed in the reception/delivery part PS. The indexer robot IR receives the processed substrate W from the reception/delivery part PS and contains the substrate W in any substrate container C of the plurality of substrate containers C.

Figure 2:
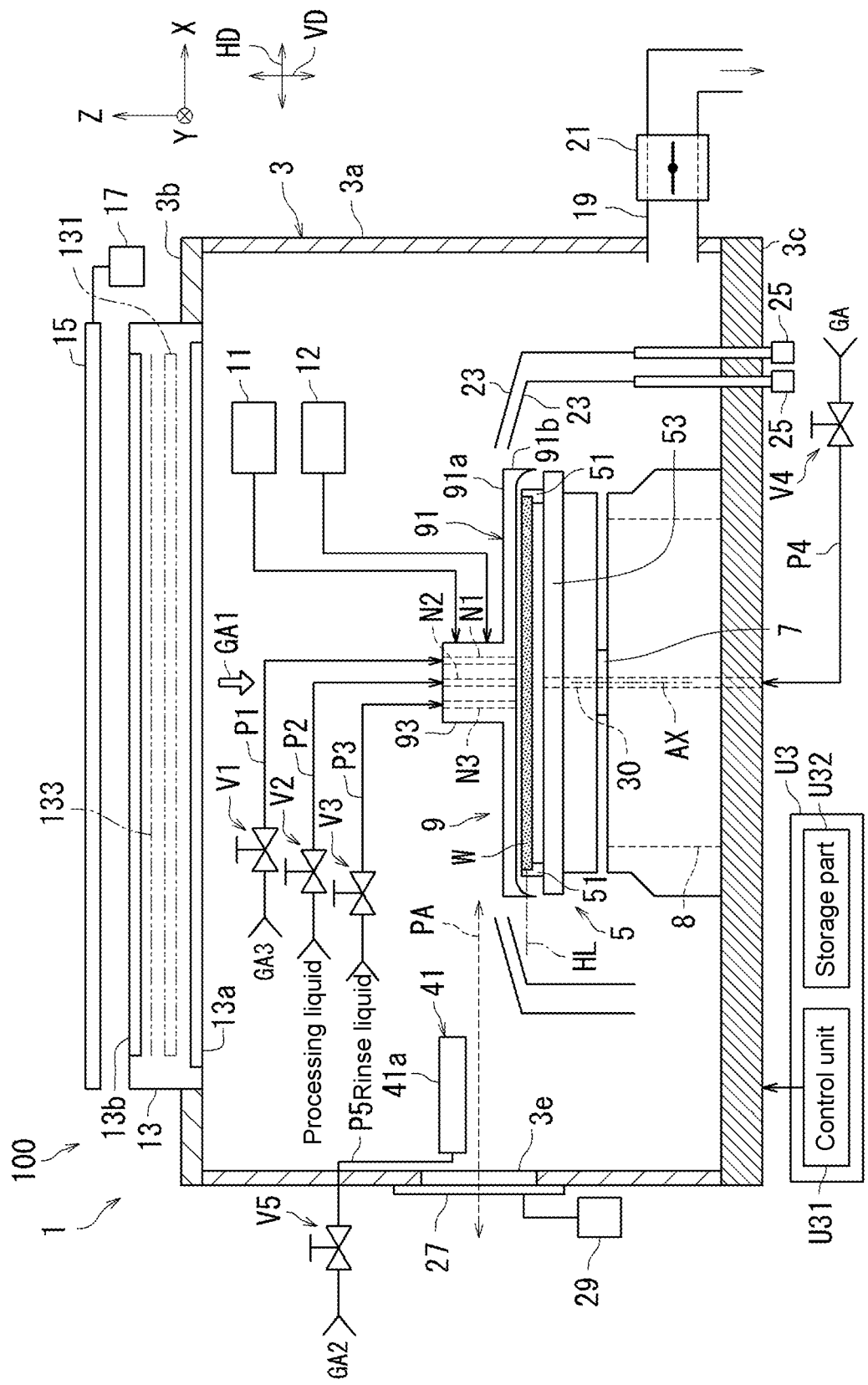
FIG. 2 is a schematic cross-sectional view showing a processing device when a blocking member is positioned at a processing position according to Embodiment 1.

Next, with reference to FIG. 2, the processing device 1 will be described. FIG. 2 is a schematic cross-sectional view showing the processing device 1. As shown in FIG. 2, the processing device 1 performs processing of the substrate W by supplying the processing liquid to the substrate W while rotating the substrate W.

The processing device 1 includes a chamber 3, a spin chuck 5, a spin shaft 7, a spin motor 8, a fluid supply unit 9, a unit elevating mechanism 11, a unit rotating mechanism 12, a first gas supply part 13, an opening/closing member 15, a member moving mechanism 17, an exhaust pipe 19, an exhaust adjustment part 21, a plurality of guards 23, a plurality of guard moving mechanisms 25, a shutter 27, a shutter moving mechanism 29, a flow channel pipe 30, a second gas supply part 41, a piping P1, a piping P2, a piping P3, a piping P4, a piping P5, a valve V1, a valve V2, a valve V3, a valve V4, and a valve V5.

The chamber 3 has a substantially box shape. The chamber 3 contains the spin chuck 5, the spin shaft 7, the spin motor 8, the fluid supply unit 9, the unit elevating mechanism 11, the unit rotating mechanism 12, the plurality of guards 23, the plurality of guard moving mechanisms 25, the flow channel pipe 30, a portion of the piping P1, a portion of the piping P2, a portion of the piping P3, and a portion of the piping P5. The chamber 3 may contain or does not have to contain the valve V1, the valve V2, the valve V3, and the valve V5.

Specifically, the chamber 3 includes a side wall part 3a, a top wall part 3b, and a bottom wall part 3c. The side wall part 3a has a substantially square tube shape and is disposed around the spin chuck 5. Specifically, the side wall part 3a surrounds the spin chuck 5 in a circumferential direction around a rotary axis AX. Therefore, the side wall part 3*a* is positioned on an outward side of the spin chuck 5 in a horizontal direction HD. The top wall part 3*b* has a substantially flat plate shape and is positioned above the spin chuck 5. Specifically, the top wall part 3*b* is positioned on an upward side of the spin chuck 5 in a direction of the rotary axis AX. Therefore, the top wall part 3*b* is positioned on an upward side of the spin chuck 5 in a vertical direction VD. The bottom wall part 3*c* has a substantially flat plate shape and is positioned below the spin chuck 5.

The first gas supply part 13 is disposed in the top wall part 3*b*. The first gas supply part 13 supplies a first gas GA1 downward in the vertical direction VD. That is, the first gas supply part 13 supplies the first gas GA1 toward a side on which the spin chuck 5 is positioned. The first gas GA1 is air in Embodiment 1.

Specifically, the first gas supply part 13 has a supply port 13*a* and a suction port 13*b*. The supply port 13*a* is an opening for supplying the first gas GA1 toward the side on which the spin chuck 5 is positioned. The suction port 13*b* is an opening for suctioning the first gas GA1 from outside of the chamber 3. The first gas supply part 13 suctions the first gas GA1 through the suction port 13*b* and sends out the first gas GA1 through the supply port 13*a*.

The first gas supply part 13 includes a fan 131 and a filter 133. The filter 133 filters the first gas GA1. The fan 131 suctions the first gas GA1 through the suction port 13*b* and sends out the first gas GA1 filtered by the filter 133 through the supply port 13*a*. In this case, for example, the first gas GA1 is clean air. For example, the first gas supply part 13 is a fan filter unit (FFU).

The opening/closing member 15 releases or closes the suction port 13*b*. In FIG. 2, the opening/closing member 15 releases the suction port 13*b*. Therefore, the first gas supply part 13 can suction the first gas GA1 through the suction port 13*b* and can send out the first gas GA1 through the supply port 13*a*. For example, the opening/closing member 15 has a substantially flat plate shape.

Figure 3:
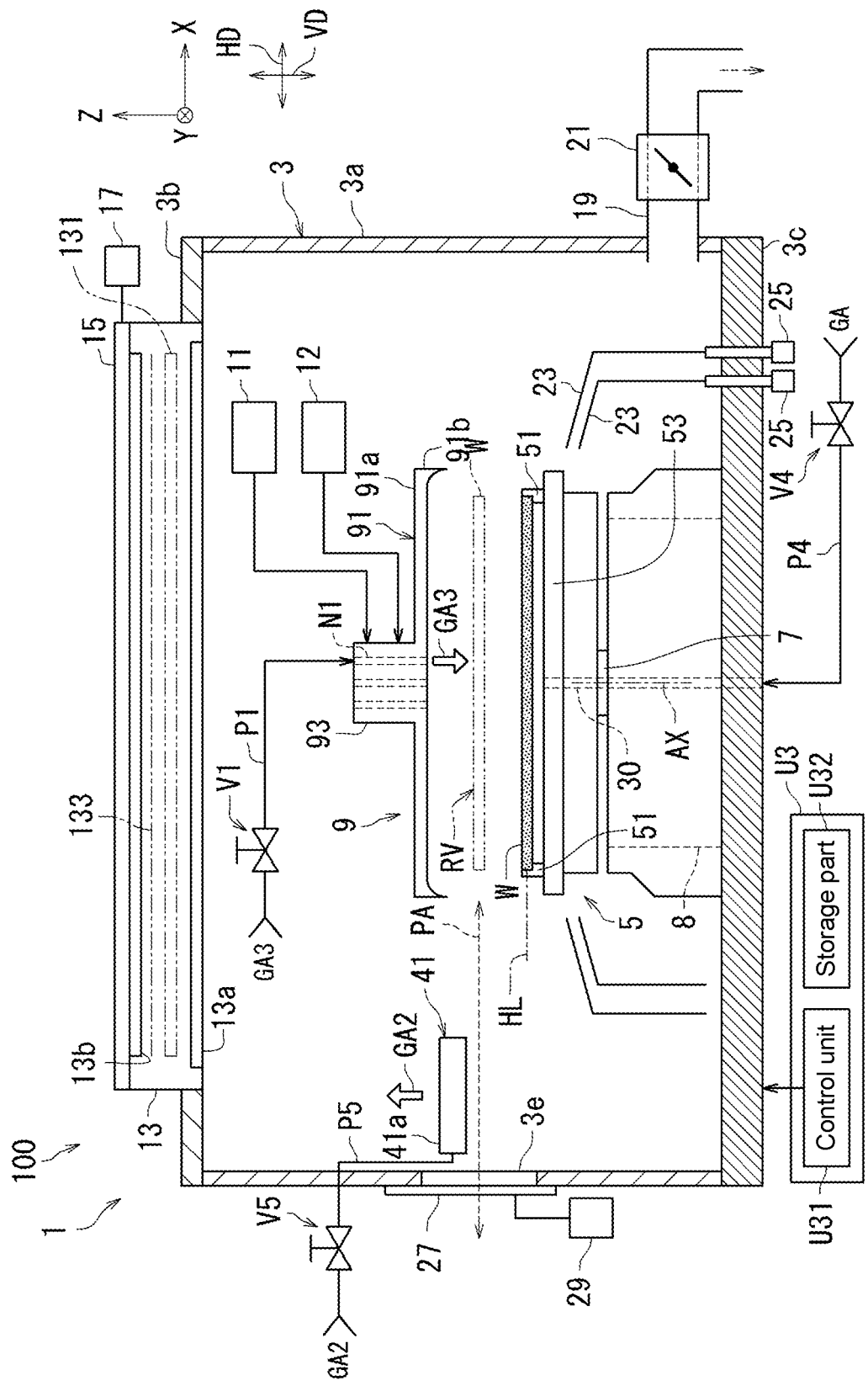
FIG. 3 is a schematic cross-sectional view showing the processing device when the blocking member is positioned at a retreat position according to Embodiment 1.

The member moving mechanism 17 moves the opening/closing member 15 between an open position and a closed position. The open position indicates a position at which the opening/closing member 15 releases the suction port 13*b*. In FIG. 2, the opening/closing member 15 is positioned at the open position. The closed position indicates a position at which the opening/closing member 15 closes the suction port 13*b* (FIG. 3). In Embodiment 1, the member moving mechanism 17 moves the opening/closing member 15 upward or downward between the open position and the closed position. For example, the member moving mechanism 17 includes a cylinder and a driving mechanism for driving the cylinder.

The second gas supply part 41 supplies a second gas GA2 to the inside of the chamber 3. For example, the second gas supply part 41 may include a fan and/or a nozzle. The second gas GA2 is a gas different from oxygen and different from an allotrope of oxygen. For example, the second gas GA2 is an inert gas. For example, the inert gas is nitrogen. In Embodiment 1, the second gas GA2 is nitrogen. Specifically, the second gas supply part 41 has an air feeding port part 41*a* for supplying the second gas GA2 to the inside of the chamber 3. For example, the air feeding port part 41*a* has a single opening, a plurality of openings, a single hole, or a plurality of holes. The shapes of the openings and the holes and the sizes of the openings and the holes are not particularly limited as long as the second gas GA2 can pass therethrough. The second gas supply part 41 will be described below in detail.

The piping P5 supplies the second gas GA2 to the second gas supply part 41. The valve V5 switches between start of supply and stopping of supply of the second gas GA2 with respect to the second gas supply part 41. When the valve V5 is opened, the second gas GA2 is supplied to the second gas supply part 41, and the second gas supply part 41 supplies the second gas GA2 to the inside of the chamber.

The spin chuck 5 holds the substrate W. Further, the spin chuck 5 holds and rotates the substrate W. Specifically, the spin chuck 5 rotates the substrate W around the rotary axis AX of the spin chuck 5 while horizontally holding the substrate W inside the chamber 3. The spin chuck 5 corresponds to an example of "a substrate holding part".

The spin chuck 5 includes a plurality of chuck members 51 and a spin base 53. The plurality of chuck members 51 are provided in the spin base 53. The plurality of chuck members 51 hold the substrate W in a horizontal posture. The spin base 53 has a substantially circular plate shape and supports the plurality of chuck members 51 in a horizontal posture.

The spin shaft 7 is fixed to the spin base 53. In addition, the spin shaft 7 is fixed to a drive shaft of the spin motor 8. Further, the spin motor 8 rotates the spin base 53 around the rotary axis AX by rotating the spin shaft 7. As a result, the substrate W held by the plurality of chuck members 51 provided in the spin base 53 rotates around the rotary axis AX.

The fluid supply unit 9 supplies a fluid. The fluid supply unit 9 is positioned above the spin chuck 5. Specifically, the fluid supply unit 9 includes a blocking member 91, a spindle 93, a third gas supply part N1, a processing liquid supply part N2, and a rinse liquid supply part N3.

The blocking member 91 has a substantially disk shape. The outer diameter of the blocking member 91 is larger than the outer diameter of the substrate W. The blocking member 91 is disposed such that a central axis of the blocking member 91 is positioned on the rotary axis AX of the spin chuck 5. The blocking member 91 is positioned above the spin chuck 5. Specifically, the blocking member 91 includes a circular plate part 91*a* and a circumferential wall part 91*b*. The circular plate part 91*a* has a substantially circular plate shape and is held by the spindle 93 in a horizontal posture. The circumferential wall part 91*b* has a substantially cylindrical shape and extends downward from an outer edge part of the circular plate part 91*a*. The blocking member 91 does not have to include the circumferential wall part 91*b*. In this case, the outer diameter of the blocking member 91 is substantially the same as the outer diameter of the substrate W.

The blocking member 91 moves upward or downward between a processing position and a retreat position. The processing position indicates a position to which the blocking member 91 moves downward to be disposed facing a surface of the substrate W with a gap therebetween. Specifically, the processing position indicates a position at which the blocking member 91 approaches the surface of the substrate W with a gap therebetween while facing the surface of the substrate W in the vertical direction VD. In FIG. 2, the blocking member 91 is positioned at the processing position.

The blocking member 91 covers a side above the surface of the substrate W and blocks the side above the surface of the substrate W at the processing position. That is, the blocking member 91 blocks the side above the surface of the substrate W from a gas inside the chamber 3 at the processing position. Moreover, the blocking member 91 surrounds an outer edge part of the substrate W at the processing position. Specifically, the circular plate part 91a faces the surface of the substrate W in the vertical direction VD at the processing position. The circumferential wall part 91b faces the outer edge part of the substrate W in the horizontal direction HD at the processing position.

The retreat position indicates a position to which the blocking member 91 moves upward to separate from the surface of the substrate W (FIG. 3). Specifically, the retreat position indicates a position on an upward side of the processing position in the vertical direction VD and a position at which the blocking member 91 is away from the processing position.

The unit elevating mechanism 11 supports the fluid supply unit 9 and moves the fluid supply unit 9 upward or downward between the processing position and the retreat position. That is, the unit elevating mechanism 11 moves the blocking member 91 upward or downward between the processing position and the retreat position. For example, the unit elevating mechanism 11 includes a ball screw mechanism and an elevation motor for applying a driving force to the ball screw mechanism. For example, the elevation motor is a servo motor.

The unit rotating mechanism 12 supports the fluid supply unit 9 and rotates the fluid supply unit 9. That is, the unit rotating mechanism 12 rotates the blocking member 91. Specifically, the unit rotating mechanism 12 rotates the fluid supply unit 9 at the processing position. That is, the unit rotating mechanism 12 rotates the blocking member 91 at the processing position. For example, the unit rotating mechanism 12 includes a motor and a transmission mechanism for transmitting rotation of the motor to the fluid supply unit 9.

The third gas supply part N1 is disposed in the blocking member 91 and the spindle 93. Specifically, the third gas supply part N1 is disposed inside the blocking member 91 and the spindle 93. The third gas supply part N1 supplies a third gas GA3 downward from the blocking member 91. The third gas GA3 is a gas different from oxygen and different from an allotrope of oxygen. For example, the third gas GA3 is an inert gas. For example, the inert gas is nitrogen. In Embodiment 1, the third gas GA3 is nitrogen.

For example, the third gas supply part N1 includes a nozzle. A distal end of the nozzle is exposed from a lower surface of the blocking member 91. The piping P1 is connected to the third gas supply part N1. The piping P1 supplies the third gas GA3 to the third gas supply part N1. The valve V1 switches between start of supply and stopping of supply of the third gas GA3 with respect to the third gas supply part N1. When the valve V1 is opened, the third gas GA3 is supplied to the third gas supply part N1, the third gas supply part N1 supplies the third gas GA3 downward from the blocking member 91.

The processing liquid supply part N2 is disposed inside the blocking member 91 and the spindle 93. The processing liquid supply part N2 supplies the processing liquid downward from the blocking member 91. For example, the processing liquid supply part N2 includes a nozzle. The distal end of the nozzle is exposed from the lower surface of the blocking member 91. The piping P2 is connected to the processing liquid supply part N2. The piping P2 supplies the processing liquid to the processing liquid supply part N2. The valve V2 switches between start of supply and stopping of supply of the processing liquid with respect to the processing liquid supply part N2. When the valve V2 is opened, the processing liquid is supplied to the processing liquid supply part N2, and the processing liquid supply part N2 supplies the processing liquid downward from the blocking member 91. Specifically, the processing liquid supply part N2 supplies the processing liquid toward the substrate W at the processing position.

For example, the processing liquid is a chemical solution. For example, the chemical solution is hydrofluoric acid (HF), fluoric nitric acid (a liquid mixture of hydrofluoric acid and nitric acid ($HNO_3$)), buffered hydrofluoric acid (BHF), ammonium fluoride, HFEG (a liquid mixture of hydrofluoric acid and ethylene glycol), phosphoric acid ($H_3PO_4$), sulfuric acid, acetic acid, nitric acid, hydrochloric acid, diluted hydrofluoric acid (DHF), ammonia water, a hydrogen peroxide solution, organic acid (for example, citric acid or oxalic acid), organic alkali (for example, TMAH: tetramethylammonium hydroxide), sulfuric acid hydrogen peroxide solution mixture (SPM), an ammonia hydrogen peroxide solution mixture (SC1), hydrochloric acid hydrogen peroxide solution mixture (SC2), a surfactant, or a corrosion inhibitor. The kind of the processing liquid is not particularly limited as long as the substrate W can be processed.

The rinse liquid supply part N3 is disposed inside the blocking member 91 and the spindle 93. The rinse liquid supply part N3 supplies a rinse liquid downward from the blocking member 91. For example, the rinse liquid supply part N3 includes a nozzle. A distal end of the nozzle is exposed from the lower surface of the blocking member 91. The piping P3 is connected to the rinse liquid supply part N3. The piping P3 supplies the rinse liquid to the rinse liquid supply part N3. The valve V3 switches between start of supply and stopping of supply of the rinse liquid with respect to the rinse liquid supply part N3. When the valve V3 is opened, the rinse liquid is supplied to the rinse liquid supply part N3, and the rinse liquid supply part N3 supplies the rinse liquid downward from the blocking member 91. Specifically, the rinse liquid supply part N3 supplies the rinse liquid toward the substrate W at the processing position.

For example, the rinse liquid is deionized water, carbonated water, electrolytic ionic water, hydrogen water, ozone water, or hydrochloric acid water having a diluted concentration (for example, approximately 10 ppm to 100 ppm). The kind of the rinse liquid is not particularly limited as long as the substrate W can be rinsed.

Each of the plurality of guards 23 has a substantially tubular shape. Each of the plurality of guards 23 receives the processing liquid or the rinse liquid discharged from the substrate W.

The plurality of guard moving mechanisms 25 are disposed respectively corresponding to the plurality of guards 23. The guard moving mechanism 25 moves the guard 23 upward or downward between a liquid reception position and a retreat position. The liquid reception position indicates a position when the guard 23 moves upward such that an upper end of the guard 23 is positioned on an upward side of the substrate W in the vertical direction VD. The retreat position indicates a position when the guard 23 moves downward such that the upper end of the guard 23 is positioned on a downward side of the substrate W in the vertical direction VD. For example, the guard moving mechanism 25 includes a ball screw mechanism and a motor for applying a driving force to the ball screw mechanism.

The flow channel pipe 30 extends from the bottom wall part 3c to the spin base 53. The flow channel pipe 30 supplies a gas GA toward the substrate W from below the substrate W. A gas supply port of the flow channel pipe 30 is exposed on an upper surface of the spin base 53. The gas GA is a gas different from oxygen and different from an allotrope of oxygen. For example, the gas GA is an inert gas. For example, the inert gas is nitrogen. In Embodiment 1, the gas GA is nitrogen.

The piping P4 supplies the gas GA to the flow channel pipe 30. The valve V4 switches between start of supply and stopping of supply of the gas GA with respect to the flow channel pipe 30. When the valve V4 is opened, the gas GA is supplied from the piping P4 to the flow channel pipe 30, and the flow channel pipe 30 supplies the gas GA toward the substrate W from below the substrate W.

The exhaust pipe 19 is disposed on a downward side of the spin chuck 5 in the vertical direction VD. For example, the exhaust pipe 19 communicates with the inside of the chamber 3 from a lower part of the side wall part 3a. The exhaust pipe 19 may communicate with the inside of the chamber 3 from the bottom wall part 3c. A gas inside the chamber 3 passes through the exhaust pipe 19. That is, a gas discharged from the chamber 3 passes through the exhaust pipe 19.

The exhaust adjustment part 21 is disposed in the exhaust pipe 19. Further, the exhaust adjustment part 21 adjusts the flow rate of a gas discharged through the exhaust pipe 19. For example, the exhaust adjustment part 21 includes a damper.

The side wall part 3a of the chamber 3 has an opening 3e. That is, the opening 3e is provided in the side wall part 3a. The opening 3e is able to be opened and closed. Specifically, the shutter 27 is disposed in the side wall part 3a. Further, the shutter 27 moves between the closed position at which the opening 3e is closed and the open position at which the opening 3e is released.

The shutter moving mechanism 29 is coupled to the shutter 27 and moves the shutter 27 between the closed position and the open position. For example, the shutter moving mechanism 29 includes a cylinder and a driving mechanism for driving the cylinder.

The conveyance robot CR (FIG. 1) carries the substrate W into the chamber 3 via the opening 3e. Specifically, the conveyance robot CR conveys the substrate W to the spin chuck 5 inside the chamber 3 via the opening 3e. In addition, the conveyance robot CR carries out the substrate W from the chamber 3 via the opening 3e. Specifically, the conveyance robot CR conveys the substrate W from the spin chuck 5 inside the chamber 3 to outside of the chamber 3 via the opening 3e. Therefore, the chamber 3 has a conveyance path PA for the substrate W. The conveyance path PA indicates a path at the time of conveying the substrate W via the opening 3e. In Embodiment 1, the conveyance path PA lies in the horizontal direction HD.

For example, the conveyance path PA indicates a path between the opening 3e and a predetermined position RV (FIG. 3). The predetermined position RV indicates a position immediately above the spin chuck 5 and a position at which a hand of the conveyance robot CR does not contact with the spin chuck 5 when the conveyance robot CR moves in the horizontal direction HD. In FIG. 3, the substrate W positioned at the predetermined position RV is indicated by a double-dotted dashed line.

For example, the predetermined position RV indicates a substrate reception/delivery position. The substrate reception/delivery position indicates a position above the spin chuck 5 and a position at which the substrate W is received and delivered between the hand of the conveyance robot CR and a lifter (not shown). The lifter supports the substrate W and moves upward or downward.

For example, the hand of the conveyance robot CR conveys the substrate W to the substrate reception/delivery position through the opening 3e and the conveyance path PA. Further, the lifter receives the substrate W positioned at the substrate reception/delivery position. Moreover, the lifter moves the substrate W downward from the substrate reception/delivery position and places the substrate W on the spin chuck 5 (specifically, the plurality of chuck members 51). Then, the lifter moves further downward.

For example, the lifter receives the substrate W from the spin chuck 5 (specifically, the plurality of chuck members 51) and moves the substrate W upward to the substrate reception/delivery position. Further, the hand of the conveyance robot CR receives the substrate W positioned at the substrate reception/delivery position. The lifter moves downward. Moreover, the hand of the conveyance robot CR carries out the substrate W from the substrate reception/delivery position in the chamber 3 through the conveyance path PA and the opening 3e.

The control device U3 controls the processing devices 1. Specifically, the control device U3 includes a control unit U31 and a storage part U32. The control unit U31 includes a processor such as a central processing unit (CPU). The storage part U32 includes a storage device and stores data and a computer program. The storage device includes a main storage device such as a semiconductor memory, and an auxiliary storage device such as a semiconductor memory and/or a hard disk drive. The storage device may include removable media. The processor of the control unit U31 executes the computer program stored in the storage device of the storage part U32 and controls the processing devices 1.

That is, the control unit U31 controls the spin chuck 5, the spin motor 8, the fluid supply unit 9, the unit elevating mechanism 11, the unit rotating mechanism 12, the first gas supply part 13, the opening/closing member 15, the member moving mechanism 17, the exhaust adjustment part 21, the plurality of guards 23, the plurality of guard moving mechanisms 25, the shutter 27, the shutter moving mechanism 29, the second gas supply part 41, and the valve V1 to the valve V5.

For example, the control unit U31 controls the second gas supply part 41 via the valve V5. For example, the control unit U31 controls the third gas supply part N1 of the fluid supply unit 9 via the valve V1. For example, the control unit U31 controls the blocking member 91 of the fluid supply unit 9 via the unit elevating mechanism 11 and the unit rotating mechanism 12. For example, the control unit U31 controls the opening/closing member 15 via the member moving mechanism 17. For example, the control unit U31 controls the shutter 27 via the shutter moving mechanism 29.

Next, with reference to FIGS. 2 and 3, a gas supply mode of the substrate processing device 100 will be described. The gas supply mode is a mode at the time of supplying a gas to the inside of the chamber 3. Specifically, the processing devices 1 have the gas supply mode. The gas supply mode includes a first gas supply mode and a second gas supply mode. The first gas supply mode is a mode in which at least the first gas supply part 13 supplies the first gas GA1 to the inside of the chamber 3. The second gas supply mode is a mode in which at least the second gas supply part 41 supplies the second gas GA2 to the inside of the chamber 3.

First, with reference to FIG. 2, the first gas supply mode will be described. Hereinafter, a period of performing processing of the substrate W will be sometimes referred as "a substrate processing period T1". The substrate processing period T1 may include not only the period of performing processing of the substrate W using the processing liquid, but also a period before the period of performing processing of the substrate W using the processing liquid and/or a period after the period of performing processing of the substrate W using the processing liquid. That is, the substrate processing period T1 includes the period of performing processing of the substrate W using the processing liquid, does not include a period before the substrate W is carried into the chamber 3, and does not include a period after a series of processing has been completed with respect to the substrate W. In other words, the substrate processing period T1 indicates a period of executing a series of processing with respect to the substrate W.

As shown in FIG. 2, during the substrate processing period T1, the control unit U31 sets the gas supply mode of the substrate processing device 100 (specifically, the processing devices 1) to the first gas supply mode and controls each of the constituents of the processing devices 1.

That is, in the first gas supply mode, the shutter 27 closes the opening 3e. The opening/closing member 15 releases the suction port 13b. Therefore, the first gas supply part 13 supplies the first gas GA1 downward in the vertical direction VD. The exhaust adjustment part 21 fully opens a flow channel of the exhaust pipe 19. The blocking member 91 is positioned at the processing position. The third gas supply part N1 supplies the third gas GA3 toward the substrate W. Therefore, due to the third gas GA3, a gas including oxygen is discharged from between the substrate W and the blocking member 91. Further, since the blocking member 91 blocks a side above the substrate W and a lateral side thereof, a space between the substrate W and the blocking member 91 is filled with the third gas GA3. Therefore, the oxygen concentration in an atmosphere contact with the substrate W can be decreased. Furthermore, the flow channel pipe 30 supplies the gas GA to a space between the substrate W and the spin base 53. Therefore, due to the gas GA, a gas including oxygen is discharged from between the substrate W and the spin base 53. As a result, the oxygen concentration in an atmosphere contact with the substrate W can be further decreased.

In addition, in the first gas supply mode, since the valve V5 is closed, the second gas supply part 41 does not supply the second gas GA2 to the inside of the chamber 3.

As described above with reference to FIG. 2, according to Embodiment 1, the control unit U31 controls the first gas supply part 13 such that the first gas GA1 is supplied during the substrate processing period T1. Therefore, the first gas supply part 13 supplies the first gas GA1 downward in the vertical direction VD. Furthermore, the control unit U31 controls the second gas supply part 41 via the valve V5 such that the second gas GA2 is not supplied. Therefore, the second gas supply part 41 does not supply the second gas GA2. As a result, according to Embodiment 1, a downflow due to the first gas GA1 can be generated effectively inside the chamber 3 during the substrate processing period T1.

In addition, according to Embodiment 1, the control unit U31 controls the opening/closing member 15 via the member moving mechanism 17 such that the opening/closing member 15 releases the suction port 13b during the substrate processing period T1. Therefore, the opening/closing member 15 releases the suction port 13b. As a result, during the substrate processing period T1, a downflow due to the first gas GA1 can be generated effectively inside the chamber 3 with a simple constitution.

Moreover, according to Embodiment 1, the control unit U31 controls the exhaust adjustment part 21 such that a gas is discharged through the exhaust pipe 19 during the substrate processing period T1. Therefore, the exhaust adjustment part 21 releases the flow channel of the exhaust pipe 19 such that a gas is discharged through the exhaust pipe 19. As a result, the first gas GA1 supplied by the first gas supply part 13 is discharged effectively from the exhaust pipe 19, so that a downflow due to the first gas GA1 can be generated more effectively during the substrate processing period T1. Particularly, when the exhaust adjustment part 21 fully opens the flow channel of the exhaust pipe 19, a downflow due to the first gas GA1 can be generated more effectively.

Moreover, according to Embodiment 1, the control unit U31 controls the blocking member 91 via the unit elevating mechanism 11 such that the blocking member 91 is positioned at the processing position during the substrate processing period T1. Therefore, the blocking member 91 is positioned at the processing position. Furthermore, the control unit U31 controls the third gas supply part N1 via the valve V1 such that the third gas supply part N1 supplies the third gas GA3. Therefore, the third gas supply part N1 supplies the third gas GA3 to the space between the blocking member 91 and the substrate W. As a result, the space between the substrate W and the blocking member 91 is filled with the third gas GA3. Consequently, the oxygen concentration in an atmosphere contact with the substrate W can be decreased. Thus, oxidation of the substrate W at the time of processing the substrate W inside the chamber 3 can be curbed.

Next, with reference to FIG. 3, the second gas supply mode will be described. Hereinafter, a period after the substrate W is processed and before the substrate W is carried out from the chamber 3 will be sometimes referred as "a period T21 before a substrate is carried out". Specifically, the period T21 before a substrate is carried out indicates a period after a series of processing is executed with respect to the substrate W and a period before the substrate W is carried out from the chamber 3. "A series of processing" includes processing of the substrate W using the processing liquid. In addition, the period before the substrate W is carried into the chamber 3 will be sometimes referred as "a period T22 before a substrate is carried in".

FIG. 3 is a schematic cross-sectional view showing the processing device 1 when the blocking member 91 is positioned at the retreat position. As shown in FIG. 3, during at least one period (which will hereinafter be referred to as "a period T2") of the period T21 before a substrate is carried out and the period T22 before a substrate is carried in, the control unit U31 sets the gas supply mode of the substrate processing device 100 (specifically, the processing devices 1) to the second gas supply mode and controls each of the constituents of the processing devices 1. In the following examples, unless otherwise specified, the control unit U31 sets the gas supply mode to the second gas supply mode during both the period T21 before a substrate is carried out and the period T22 before a substrate is carried in.

That is, in the second gas supply mode, the shutter 27 closes the opening 3e. The opening/closing member 15 closes the suction port 13b. Therefore, the first gas supply part 13 does not supply the first gas GA1. The exhaust adjustment part 21 adjusts the flow rate of a gas in the exhaust pipe 19 such that it becomes lower than the flow rate of a gas in the first gas supply mode. The blocking member 91 is positioned at the retreat position. The third gas supply part N1 supplies the third gas GA3 downward from the blocking member 91. Therefore, a gas including oxygen flows inside the chamber 3 due to the third gas GA3, moves toward the exhaust pipe 19, and is discharged. As a result, the oxygen concentration inside the chamber 3 can be decreased, and therefore oxidation of the unprocessed substrate W and the processed substrate W can be curbed. Furthermore, the flow channel pipe 30 supplies the gas GA upward from the spin base 53. Therefore, a gas including oxygen flows inside the chamber 3 due to the gas GA, moves toward the exhaust pipe 19, and is discharged. As a result, the oxygen concentration inside the chamber 3 can be further decreased, and therefore oxidation of the unprocessed substrate W and the processed substrate W can be further curbed.

In addition, in the second gas supply mode, the second gas supply part 41 supplies the second gas GA2 to the inside of the chamber 3 through the air feeding port part 41a. Therefore, according to Embodiment 1, a gas including oxygen flows inside the chamber 3 due to the second gas GA2, moves toward the exhaust pipe 19, and is discharged. As a result, the oxygen concentration inside the chamber 3 can be further decreased, and therefore oxidation of the unprocessed substrate W and the processed substrate W can be further curbed.

Here, as shown in FIG. 3, in Embodiment 1, the second gas supply part 41 is positioned on an upward side of a holding position HL of the substrate W by the spin chuck 5 in the vertical direction VD and is positioned on an outward side of the spin chuck 5 in the horizontal direction HD. Specifically, the air feeding port part 41a of the second gas supply part 41 is positioned on an upward side of the holding position HL of the substrate W in the vertical direction VD and is positioned on an outward side of the spin chuck 5 in the horizontal direction HD. Therefore, a gas including oxygen flows effectively inside the chamber 3 due to the second gas GA2 supplied through the air feeding port part 41a, moves toward the exhaust pipe 19, and is discharged effectively. As a result, according to Embodiment 1, the oxygen concentration inside the chamber 3 can be further decreased, and therefore oxidation of the unprocessed substrate W and the processed substrate W can be further curbed.

That is, the second gas supply part 41 supplies the second gas GA2 to the inside of the chamber 3 through the air feeding port part 41a during the period T21 before a substrate is carried out, so that the oxygen concentration inside the chamber 3 can be decreased when the substrate W is carried out from the chamber 3. As a result, according to Embodiment 1, oxidation of the substrate W at the time of conveying the substrate W inside the chamber 3 can be curbed.

In addition, the second gas supply part 41 supplies the second gas GA2 to the inside of the chamber 3 through the air feeding port part 41a during the period T22 before a substrate is carried in, so that the oxygen concentration inside the chamber 3 can be decreased when the substrate W is carried into the chamber 3. As a result, according to Embodiment 1, oxidation of the substrate W at the time of conveying the substrate W inside the chamber 3 can be curbed.

Particularly, in Embodiment 1, the second gas supply part 41 is disposed above the conveyance path PA for the substrate W. Specifically, the air feeding port part 41a of the second gas supply part 41 is disposed above the conveyance path PA for the substrate W. Therefore, a gas including oxygen flows effectively inside the chamber 3 due to the second gas GA2 supplied through the air feeding port part 41a, moves toward the exhaust pipe 19, and is discharged.

When the substrate W is carried into the chamber 3, the conveyance path PA from a place where the substrate W is carried into the chamber 3 to a place where the substrate W is held by the spin chuck 5 is required to be maintained in a low oxygen state. Furthermore, when the substrate W is carried out from the chamber 3, the conveyance path PA from a place where the substrate W is released from the spin chuck 5 to a place where the substrate W is carried out from the chamber 3 is required to be maintained in a low oxygen state.

In this case, the inventor of this application has found that the oxygen concentration inside the chamber 3 including the conveyance path PA can be decreased more efficiently, for example, by upflow-supplying the second gas GA2 in a direction of separating from the conveyance path PA above the conveyance path PA, being contrary to downflow-supplying an inert gas or the like toward the conveyance path PA.

That is, as described above in the operation of the air feeding port part 41a of the second gas supply part 41 in Embodiment 1, for example, when the second gas GA2 is upflow-supplied in a direction of separating from the conveyance path PA above the conveyance path PA, the second gas GA2 flows along the top wall part 3b of the chamber 3, further flows downward along the side wall part 3a, and is then discharged from the exhaust pipe 19. Consequently, regarding the oxygen concentration inside the chamber 3 including the conveyance path PA, a lower oxygen concentration can be achieved in a shorter time. As a result, according to Embodiment 1, the oxygen concentration inside the chamber 3 can be further decreased, and therefore oxidation of the unprocessed substrate W and the processed substrate W can be further curbed.

The detailed mechanism of a reason that decrease in oxygen concentration in the conveyance path PA can be achieved more efficiently by supplying the second gas GA2 in a direction of separating from the conveyance path PA instead of supplying an inert gas or the like toward the conveyance path PA for the substrate W is uncertain. However, regarding some hypotheses, for example, in order to realize a low oxygen state inside the chamber 3 at a high level as postulated in the disclosure, not only the conveyance path PA but also entry of oxygen around the conveyance path PA are taken into consideration, and it is necessary for the flow rate of a fluid inside the chamber 3 to form a stable flow. It is assumed that these are preferably realized by the method described in Embodiment 1 as an example.

Specifically, according to Embodiment 1, the second gas supply part 41 supplies the second gas GA2 through the air feeding port part 41a in a direction opposite to the conveyance path PA. That is, the second gas supply part 41 supplies the second gas GA2 toward the top wall part 3b through the air feeding port part 41a. Therefore, a portion of the second gas GA2 flows toward the top wall part 3b through the air feeding port part 41a, is then rebounded from the top wall part 3b, and flows downward or obliquely downward from the top wall part 3b. Furthermore, a portion of the second gas GA2 flows toward the top wall part 3b through the air feeding port part 41a, further flows along the top wall part 3b, and then arrives at the side wall part 3a. Further, a portion of the second gas GA2 which has arrived at the side wall part 3a is rebounded from the side wall part 3a, and a portion of the second gas GA2 which has arrived at the side wall part 3a flows downward along the side wall part 3a.

Therefore, due to a flow of the second gas GA2 supplied toward the top wall part 3b, a gas including oxygen inside the chamber 3 flows effectively inside the chamber 3, moves toward the exhaust pipe 19, and is discharged effectively. As a result, the oxygen concentration inside the chamber 3 can be decreased effectively in a short time, and therefore oxidation of the unprocessed substrate W and the processed substrate W can be curbed effectively. That is, oxidation of the substrate W at the time of conveying the substrate W inside the chamber 3 can be curbed effectively in a short time.

The second gas supply part 41 may supply the second gas GA2 upward substantially parallel to the vertical direction VD or may supply the second gas GA2 obliquely upward.

In addition, in Embodiment 1, regarding the control unit U31, during at least one period T2 of the period T21 before a substrate is carried out and the period T22 before a substrate is carried in, the control unit U31 controls the second gas supply part 41 such that the second gas GA2 is supplied. On the other hand, during at least one period T2, the control unit U31 controls the first gas supply part 13 such that the first gas GA1 is not supplied. Therefore, in the second gas supply mode, the first gas supply part 13 does not supply the first gas GA1 to the chamber 3. As a result, due to a flow of the first gas GA1, hindrance to discharging of a gas including oxygen can be curbed. Thus, when the substrate W is conveyed, the oxygen concentration inside the chamber 3 can be decreased in a shorter time.

Moreover, in Embodiment 1, during at least one period T2 of the period T21 before a substrate is carried out and the period T22 before a substrate is carried in, the control unit U31 controls the opening/closing member 15 via the member moving mechanism 17 such that the opening/closing member 15 closes the suction port 13b. Therefore, the opening/closing member 15 closes the suction port 13b. As a result, flowing of oxygen to the inside of the chamber 3 through the suction port 13b can be curbed. Thus, when the substrate W is conveyed, the oxygen concentration inside the chamber 3 can be decreased in a shorter time.

Moreover, in Embodiment 1, during at least one period T2 of the period T21 before a substrate is carried out and the period T22 before a substrate is carried in, the control unit U31 controls the blocking member 91 via the unit elevating mechanism 11 such that the blocking member 91 is positioned at the retreat position. Furthermore, during at least one period T2, the control unit U31 controls the third gas supply part N1 via the valve V1 such that the third gas supply part N1 supplies the third gas GA3. Therefore, the third gas supply part N1 supplies the third gas GA3 downward in the vertical direction VD from the retreat position. As a result, a gas including oxygen moves toward the exhaust pipe 19 and is discharged effectively. Thus, the oxygen concentration inside the chamber 3 can be further decreased, and oxidation of the substrate W at the time of conveying the substrate W can be further curbed.

Moreover, in Embodiment 1, during at least one period T2 of the period T21 before a substrate is carried out and the period T22 before a substrate is carried in, the control unit U31 controls the exhaust adjustment part 21 such that the flow rate of a gas becomes lower in the exhaust pipe 19 than the flow rate of a gas in the exhaust pipe 19 during the substrate processing period T1. Therefore, in the second gas supply mode, the exhaust adjustment part 21 adjusts the flow rate in the exhaust pipe 19 such that the flow rate becomes lower than that at the time of operation in the first gas supply mode. That is, the exhaust pressure of the exhaust pipe 19 in the second gas supply mode is lower than the exhaust pressure of the exhaust pipe 19 in the first gas supply mode. Therefore, sudden discharging of the second gas GA2 from the exhaust pipe 19 can be curbed. As a result, due to a flow of the second gas GA2, a gas including oxygen can be discharged effectively.

Figure 4:
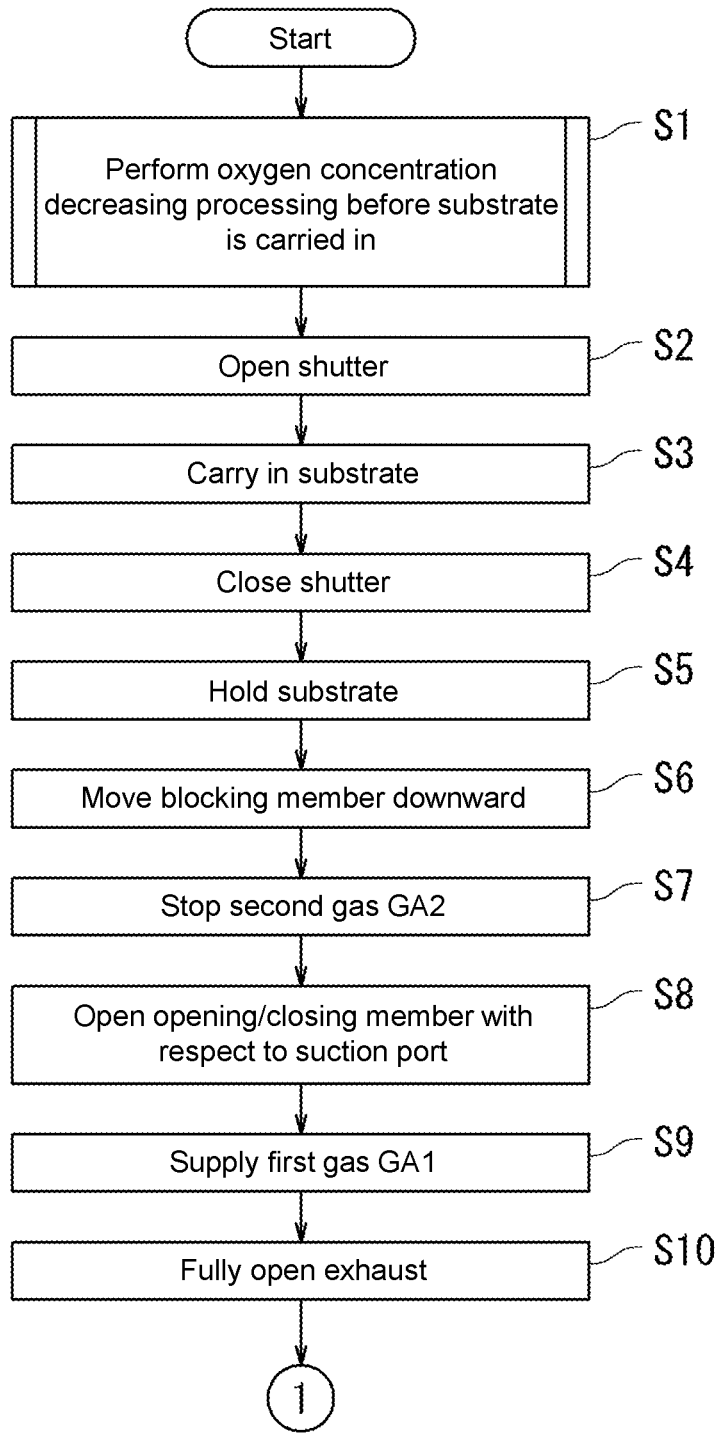
FIG. 4 is a flowchart showing a part of a substrate processing method according to Embodiment 1.
Figure 5:
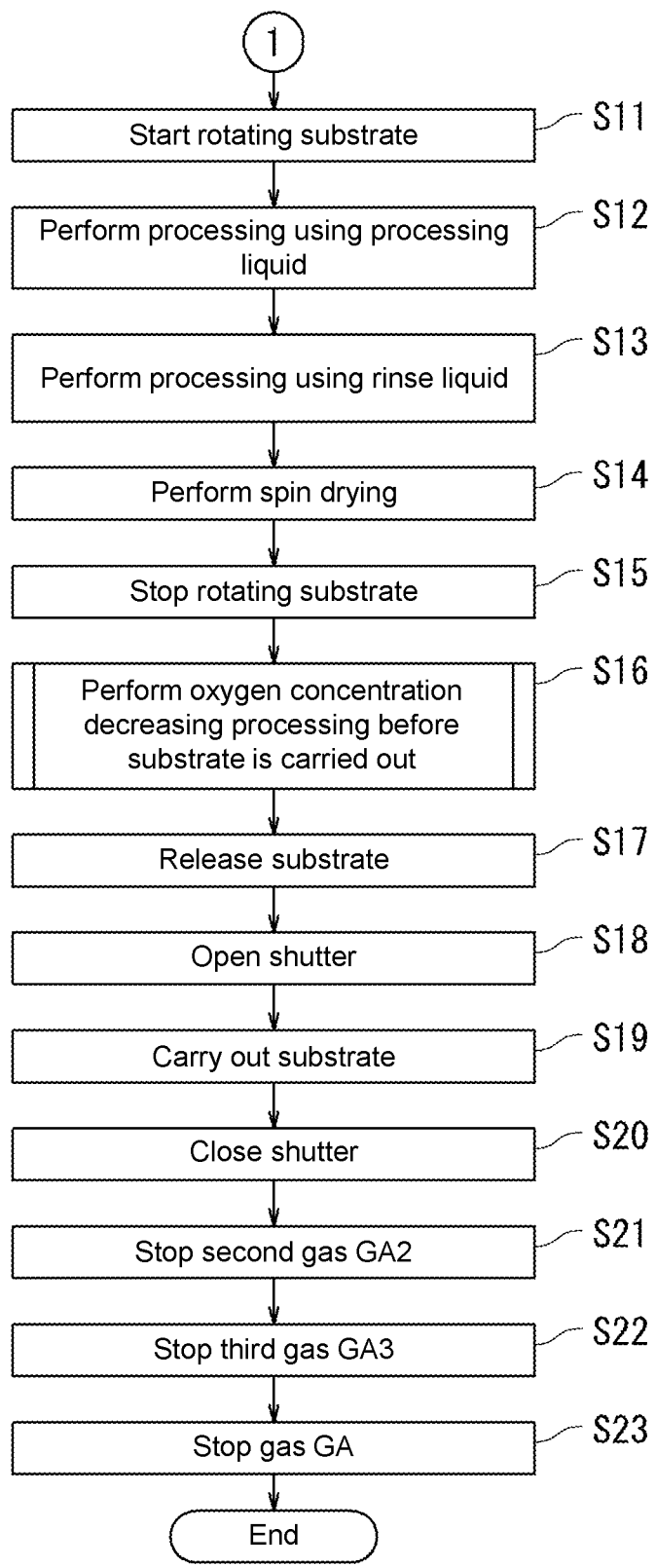
FIG. 5 is a flowchart showing another part of the substrate processing method according to Embodiment 1.
Figure 6:
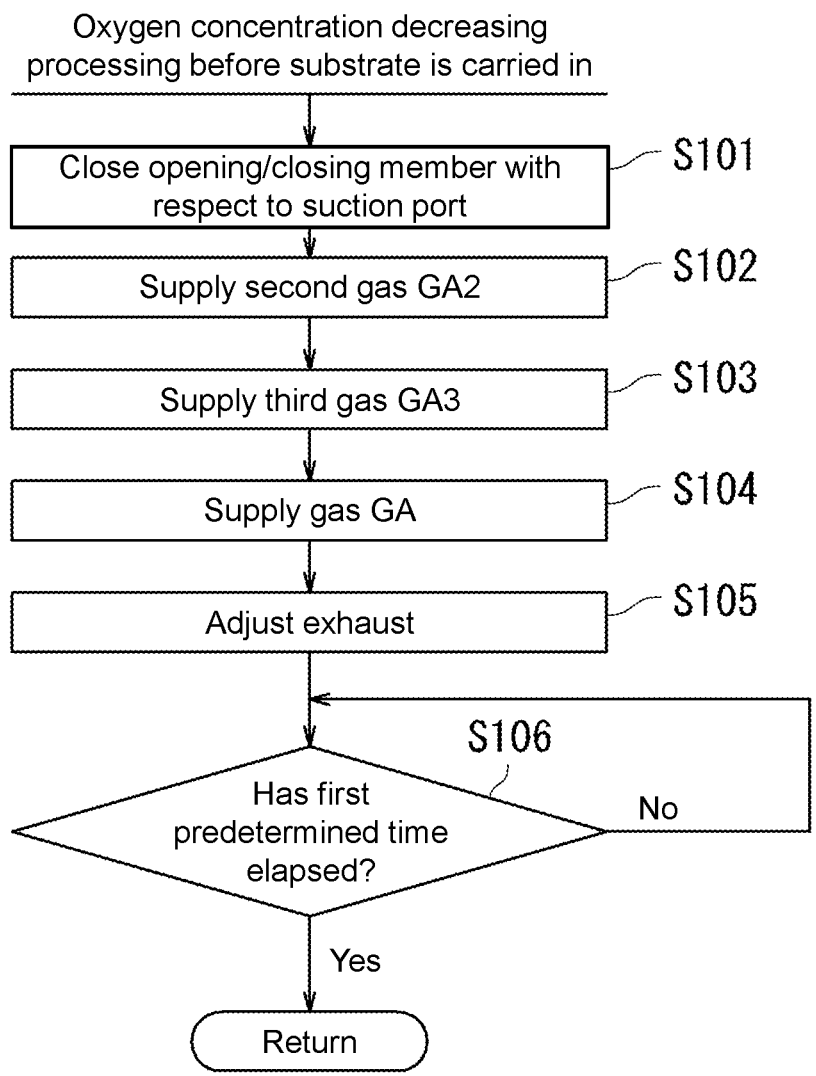
Figure 7:
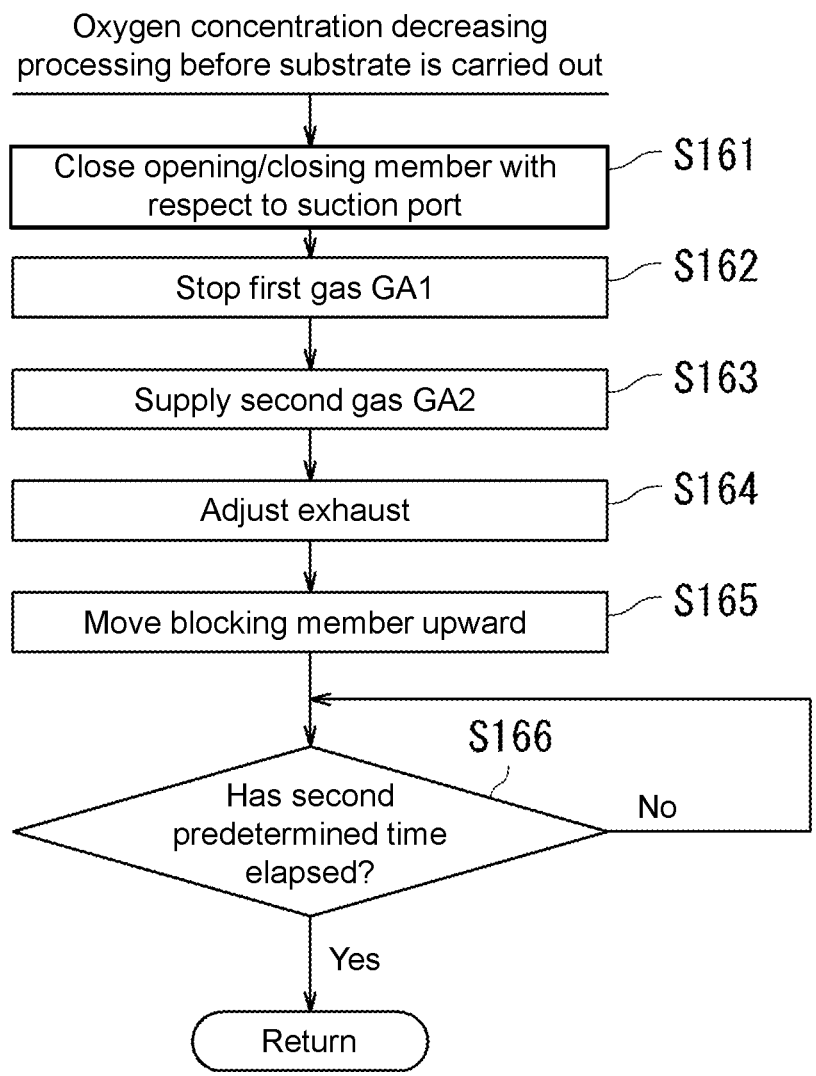
FIG. 7 is a flowchart showing oxygen concentration decreasing processing shown in FIG. 5 before a substrate is carried out.

Next, with reference to FIGS. 2 to 7, a substrate processing method according to Embodiment 1 will be described. The substrate processing method is executed by the substrate processing device 100. In the substrate processing method, the substrate W held by the spin chuck 5 inside the chamber 3 is processed. FIGS. 4 and 5 are flowcharts showing the substrate processing method according to Embodiment 1. FIG. 6 is a flowchart showing Step S1 shown in FIG. 4. Step S1 shows oxygen concentration decreasing processing before the substrate W is carried in. FIG. 7 is a flowchart showing Step S16 shown in FIG. 5. Step S16 shows oxygen concentration decreasing processing before the substrate W is carried out.

As shown in FIGS. 4 and 5, the substrate processing method includes Steps S1 to S23.

As shown in FIGS. 3 and 4, in Step S1, the substrate processing device 100 executes the oxygen concentration decreasing processing before the substrate W is carried in. The oxygen concentration decreasing processing before the substrate W is carried in is processing of decreasing the oxygen concentration inside the chamber 3 before the substrate W is carried into the chamber 3. Before the substrate W is carried in, no substrate W is present inside the chamber 3 in FIG. 3.

Specifically, as shown in FIG. 6, the oxygen concentration decreasing processing before the substrate W is carried in includes Steps S101 to S106.

As shown in FIGS. 3 and 6, in Step S101, the control unit U31 controls the member moving mechanism 17 such that the opening/closing member 15 closes the suction port 13b. As a result, the opening/closing member 15 closes the suction port 13b. Particularly, in accordance with execution of Step S101, the suction port 13b is closed during the period T22 before a substrate is carried in.

Next, in Step S102, the control unit U31 controls the valve V5 such that the second gas supply part 41 supplies the second gas GA2. As a result, the second gas supply part 41 supplies the second gas GA2 toward the inside of the chamber 3. Specifically, in Step S102, the second gas supply part 41 supplies the second gas GA2 from a position on an upward side of the holding position HL (FIG. 3) of the substrate W by the spin chuck 5 in the vertical direction VD and a position on an outward side of the spin chuck 5 in the horizontal direction HD. Particularly, in Step S102, the second gas supply part 41 supplies the second gas GA2 to the inside of the chamber 3 during a period different from the period of executing Step S9 in which the first gas GA1 is supplied. Moreover, in Step S102, the second gas supply part 41 supplies the second gas GA2 during the period T22 before a substrate is carried in.

In addition, in Step S102, it is preferable that the second gas supply part 41 supply the second gas GA2 toward the top wall part 3b. Moreover, in Step S102, it is preferable that the second gas GA2 be supplied from a position above the conveyance path PA for the substrate W (FIG. 3).

Unless the control unit U31 controls the valve V5 to stop supplying of the second gas GA2, the second gas supply part 41 continues to supply the second gas GA2.

Next, in Step S103, the control unit U31 controls the valve V1 such that the third gas supply part N1 supplies the third gas GA3. As a result, the third gas supply part N1 supplies the third gas GA3 downward from the blocking member 91. In accordance with execution of Step S103, the third gas GA3 is supplied downward from the blocking member 91 during the period T21 before a substrate is carried out, the period T22 before a substrate is carried in, and the substrate processing period T1. Unless the control unit U31 controls the valve V1 to stop supplying of the third gas GA3, the third gas supply part N1 continues to supply the third gas GA3. In addition, the blocking member 91 is positioned at the retreat position during the period T22 before a substrate is carried in.

Next, in Step S104, the control unit U31 controls the valve V4 such that the flow channel pipe 30 supplies the gas GA. As a result, the flow channel pipe 30 supplies the gas GA upward from the spin base 53. Unless the control unit U31 controls the valve V4 to stop supplying of the gas GA, the flow channel pipe 30 continues to supply the gas GA.

Next, in Step S105, the control unit U31 controls the exhaust adjustment part 21 and adjusts the flow rate of a gas in the exhaust pipe 19 such that it becomes lower than the flow rate of a gas during the substrate processing period T1. Specifically, the exhaust adjustment part 21 causes the flow rate in the exhaust pipe 19 to be lower than that at the time of being fully opened and to be higher than that at the time of being fully closed. In accordance with execution of Step S105, during the period T22 before a substrate is carried in, the flow rate of a gas is adjusted such that the flow rate of a gas becomes lower in the exhaust pipe 19 than the flow rate of a gas in the exhaust pipe 19 during the substrate processing period T1.

Next, in Step S106, the control unit U31 determines whether or not a first predetermined time has elapsed from the starting time of Step S101. The first predetermined time indicates a time required for the oxygen concentration inside the chamber 3 to have a predetermined value or smaller. For example, a predetermined value is 100 ppm.

When it is determined in Step S106 that the first predetermined time has not elapsed (No in Step S106), the processing repeats Step S106 until it is determined in Step S106 that the first predetermined time has elapsed.

On the other hand, when it is determined in Step S106 that the first predetermined time has elapsed (Yes in Step S106), the processing ends the oxygen concentration decreasing processing before the substrate W is carried in and returns to the main routine shown in FIG. 4. Specifically, the processing proceeds to Step S2 shown in FIG. 4.

As shown in FIG. 4, in Step S2, the control unit U31 controls the shutter moving mechanism 29 such that the shutter 27 releases the opening 3e. As a result, the shutter 27 releases the opening 3e.

Next, in Step S3, the control unit U31 controls the conveyance robot CR such that the substrate W is carried into the chamber 3. As a result, the conveyance robot CR carries the substrate W into the chamber 3.

Next, in Step S4, the control unit U31 controls the shutter moving mechanism 29 such that the shutter 27 closes the opening 3e. As a result, the shutter 27 closes the opening 3e.

Next, in Step S5, the control unit U31 controls the spin chuck 5 such that the substrate W is held. As a result, the spin chuck 5 holds the substrate W.

Next, in Step S6, the control unit U31 controls the unit elevating mechanism 11 such that the blocking member 91 moves downward. As a result, the blocking member 91 moves downward from the retreat position to the processing position. In accordance with execution of Step S6, the blocking member 91 is positioned at the processing position during the substrate processing period T1.

Next, in Step S7, the control unit U31 controls the valve V5 such that the second gas supply part 41 stops supplying of the second gas GA2. As a result, the second gas supply part 41 stops supplying of the second gas GA2.

Next, as shown in FIGS. 2 and 4, in Step S8, the control unit U31 controls the member moving mechanism 17 such that the opening/closing member 15 releases the suction port 13b. As a result, the opening/closing member 15 releases the suction port 13b. Particularly, in accordance with execution of Step S8, the suction port 13b is released during the substrate processing period T1.

Next, in Step S9, the control unit U31 controls the first gas supply part 13 such that the first gas supply part 13 supplies the first gas GA1. As a result, the first gas supply part 13 supplies the first gas GA1 toward the side on which the spin chuck 5 is positioned. Specifically, in Step S9, the first gas GA1 is supplied by the first gas supply part 13 from the top wall part 3b of the chamber 3 toward the side on which the spin chuck 5 surrounded by the side wall part 3a of the chamber 3 is positioned. Particularly, in accordance with execution of Step S9, the first gas GA1 is supplied during the substrate processing period T1.

Unless the control unit U31 controls the first gas supply part 13 to stop supplying of the first gas GA1, the first gas supply part 13 continues to supply the first gas GA1.

Next, in Step S10, the control unit U31 controls the exhaust adjustment part 21 such that the flow channel of the exhaust pipe 19 is fully opened. As a result, the exhaust adjustment part 21 fully opens the flow channel of the exhaust pipe 19. In accordance with execution of Step S10, a gas inside the chamber 3 is discharged from the exhaust pipe 19 during the substrate processing period T1. Further, the processing proceeds to Step S11 shown in FIG. 5.

As shown in FIG. 5, in Step S11, the control unit U31 controls the spin motor 8 such that the spin motor 8 drives the spin chuck 5 to start rotating the substrate W. As a result, the spin chuck 5 rotates, and the substrate W rotates. In addition, the control unit U31 controls the unit rotating mechanism 12 such that the blocking member 91 rotates. As a result, the blocking member 91 rotates.

Next, in Step S12, the control unit U31 controls the valve V2 such that the processing liquid supply part N2 starts supplying of the processing liquid toward the substrate W. As a result, the processing liquid supply part N2 supplies the processing liquid toward the substrate W. Specifically, the processing liquid supply part N2 supplies the processing liquid to the substrate W throughout a first predetermined period.

Next, in Step S13, the control unit U31 controls the valve V3 such that the rinse liquid supply part N3 supplies the rinse liquid toward the substrate W. As a result, the rinse liquid supply part N3 supplies the rinse liquid toward the substrate W. Specifically, the rinse liquid supply part N3 supplies the rinse liquid to the substrate W throughout a second predetermined period. As a result, the processing liquid on the substrate W is washed off by the rinse liquid, and therefore the substrate W is cleaned.

Next, in Step S14, the control unit U31 controls the spin motor 8 such that the spin chuck 5 is accelerated to a high rotation speed and the rotation speed of the spin chuck 5 maintains a high rotation speed. As a result, the substrate W rotates at a high rotation speed, the rinse liquid which has adhered to the substrate W is blown off, the substrate W dries.

Next, in Step S15, the control unit U31 controls the spin motor 8 such that the spin motor 8 stops the spin chuck 5 to stop rotation of the substrate W. As a result, the spin chuck 5 stops, and the substrate W stops. In addition, the control unit U31 controls the unit rotating mechanism 12 such that the blocking member 91 stops. As a result, the blocking member 91 stops.

Next, in Step S16, the substrate processing device 100 executes the oxygen concentration decreasing processing before the substrate W is carried out. The oxygen concentration decreasing processing before the substrate W is carried out is processing of decreasing the oxygen concentration inside the chamber 3 after the substrate W is processed and before the substrate W is carried out from the chamber 3.

As shown in FIG. 7, the oxygen concentration decreasing processing before the substrate W is carried out includes Steps S161 to S166.

As shown in FIGS. 3 and 7, in Step S161, the control unit U31 controls the member moving mechanism 17 such that the opening/closing member 15 closes the suction port 13b. As a result, the opening/closing member 15 closes the suction port 13b. Particularly, in accordance with execution of Step S161, the suction port 13b is closed during the period T21 before a substrate is carried out.

Next, in Step S162, the control unit U31 controls the first gas supply part 13 such that the first gas supply part 13 stops supplying of the first gas GA1. As a result, the first gas supply part 13 stops supplying of the first gas GA1.

Next, in Step S163, the control unit U31 controls the valve V5 such that the second gas supply part 41 supplies the second gas GA2. As a result, the second gas supply part 41 supplies the second gas GA2 toward the inside of the chamber 3. Furthermore, Step S163 is similar to Step S102. However, in Step S163, the second gas supply part 41 supplies the second gas GA2 during the period T21 before a substrate is carried out.

Unless the control unit U31 controls the valve V5 to stop supplying of the second gas GA2, the second gas supply part 41 continues to supply the second gas GA2.

Next, in Step S164, the control unit U31 controls the exhaust adjustment part 21 and adjusts the flow rate of a gas in the exhaust pipe 19 such that it becomes lower than the flow rate of a gas during the substrate processing period T1. Specifically, the exhaust adjustment part 21 causes the flow rate in the exhaust pipe 19 to be lower than at the time of being fully opened and to be higher than that at the time of being fully closed. In accordance with execution of Step S164, during the period T21 before a substrate is carried out, the flow rate of a gas is adjusted such that the flow rate of a gas becomes lower in the exhaust pipe 19 than the flow rate of a gas in the exhaust pipe 19 during the substrate processing period T1.

Next, in Step S165, the control unit U31 controls the unit elevating mechanism 11 such that the blocking member 91 moves upward. As a result, the blocking member 91 moves upward from the processing position to the retreat position. Particularly, in accordance with execution of Step S165, the blocking member 91 is positioned at the retreat position during the period T21 before a substrate is carried out.

Next, in Step S166, the control unit U31 determines whether or not a second predetermined time has elapsed from the starting time of Step S161. The second predetermined time indicates a time required for the oxygen concentration inside the chamber 3 to have a predetermined value or smaller. For example, a predetermined value is 100 ppm.

When it is determined in Step S166 that the second predetermined time has not elapsed (No in Step S166), the processing repeats Step S166 until it is determined in Step S166 that the second predetermined time has elapsed.

On the other hand, when it is determined in Step S166 that the second predetermined time has elapsed (Yes in Step S166), the processing ends the oxygen concentration decreasing processing before the substrate W is carried out and returns to the main routine shown in FIG. 5. Specifically, the processing proceeds to Step S17 shown in FIG. 5.

As shown in FIG. 5, in Step S17, the control unit U31 controls the spin chuck 5 such that the substrate W is released. As a result, the spin chuck 5 releases the substrate W.

Next, in Step S18, the control unit U31 controls the shutter moving mechanism 29 such that the shutter 27 releases the opening 3e. As a result, the shutter 27 releases the opening 3e.

Next, in Step S19, the control unit U31 controls the conveyance robot CR such that the substrate W is carried out from the chamber 3. As a result, the conveyance robot CR carries out the substrate W from the chamber 3.

Next, in Step S20, the control unit U31 controls the shutter moving mechanism 29 such that the shutter 27 closes the opening 3e. As a result, the shutter 27 closes the opening 3e.

Next, in Step S21, the control unit U31 controls the valve V5 such that the second gas supply part 41 stops supplying of the second gas GA2. As a result, the second gas supply part 41 stops supplying of the second gas GA2.

Next, in Step S22, the control unit U31 controls the valve V1 such that the third gas supply part N1 stops supplying of the third gas GA3. As a result, the third gas supply part N1 stops supplying of the third gas GA3.

Next, in Step S23, the control unit U31 controls the valve V4 such that the flow channel pipe 30 stops supplying of the gas GA. As a result, the flow channel pipe 30 stops supplying of the gas GA. Further, the processing by the substrate processing method ends.

As described above with reference to FIGS. 4 to 7, according to Embodiment 1, during the period T22 before a substrate is carried in and the period T21 before a substrate is carried out, the second gas supply part 41 supplies the second gas GA2 to the inside of the chamber 3 through the air feeding port part 41a (Steps S1 and S16). Therefore, according to Embodiment 1, a gas including oxygen flows inside the chamber 3 due to the second gas GA2, moves toward the exhaust pipe 19, and is discharged. As a result, before and after the substrate W is processed, the oxygen concentration inside the chamber 3 can be decreased effectively, and therefore oxidation of the substrate W at the time of conveying the substrate W inside the chamber 3 can be curbed effectively.

In addition, the substrate processing method according to Embodiment 1 can be utilized in a semiconductor manufacturing method. That is, in the semiconductor manufacturing method according to Embodiment 1, a semiconductor substrate W held by the spin chuck 5 inside the chamber 3 is processed by the substrate processing method including Steps S1 to S23, and a semiconductor that is a processed semiconductor substrate W is manufactured.

The substrate processing method need only include at least one step of Steps S1 and S16. In addition, supplying of the third gas GA3 and the gas GA does not have to be executed during the period T22 before a substrate is carried in and the period T21 before a substrate is carried out. Moreover, Steps S101, S105, S161, and S164 are preferable examples, and the substrate processing method does not have to include Steps S101, S105, S161, and S164. In the flowcharts shown in FIGS. 4 to 7, the sequential order of the steps can be changed suitably within a range not departing from the gist of the disclosure.

Modification Example

Figure 8:
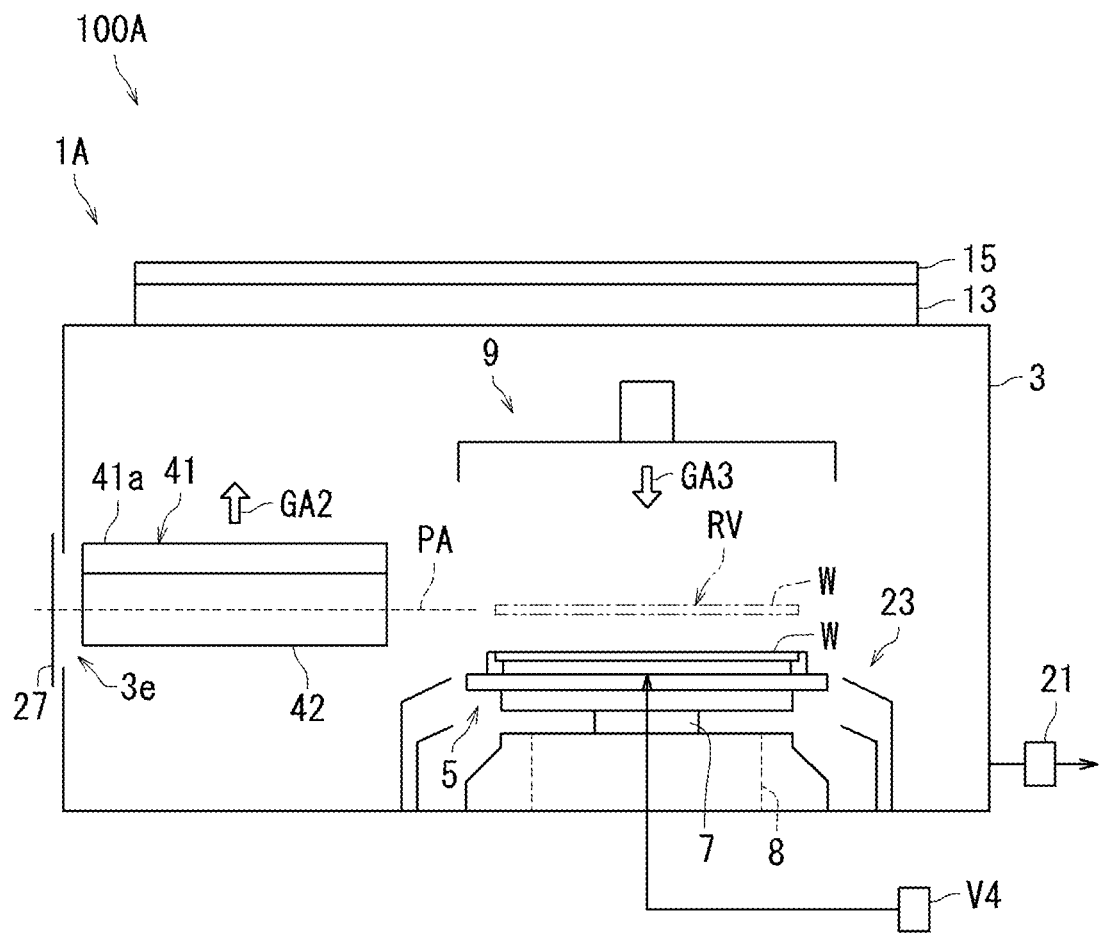
FIG. 8 is a schematic cross-sectional view showing a processing device included in a substrate processing device according to a modification example of Embodiment 1.
Figure 9:
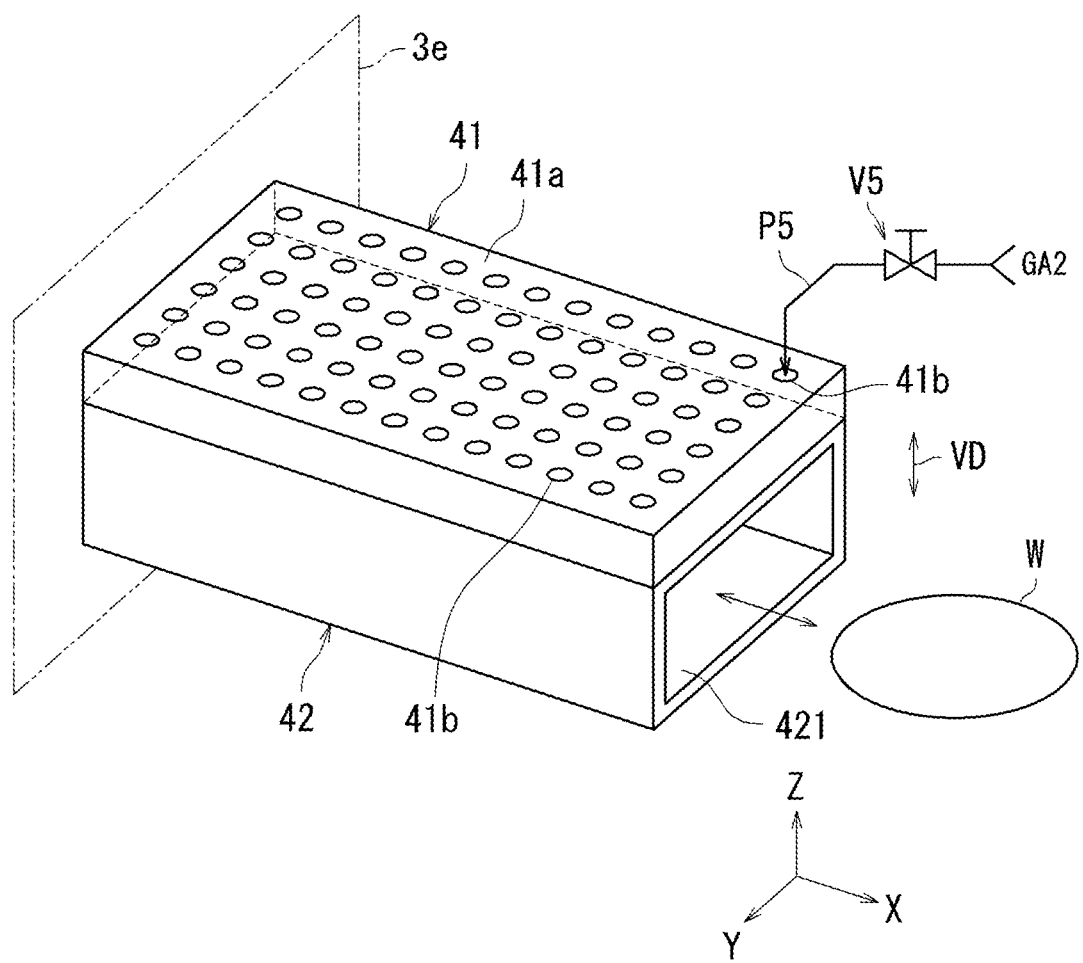
FIG. 9 is a perspective view showing a substrate conveyance guide according to the modification example of Embodiment 1.

With reference to FIGS. 8 and 9, a substrate processing device 100A according to a modification example of Embodiment 1 of the disclosure will be described. In the modification example, the modification example mainly differs from Embodiment 1 described with reference to FIGS. 1 to 7 in respect that the substrate processing device 100A includes a substrate conveyance guide 42 at the time of conveying the substrate W. Hereinafter, differences between the modification example and Embodiment 1 will be mainly described.

FIG. 8 is a schematic cross-sectional view showing a processing device 1A included in the substrate processing device 100A according to the modification example. As shown in FIG. 8, in addition to the constitution of the processing device 1 shown in FIG. 2, the processing device 1A further includes the substrate conveyance guide 42.

The substrate conveyance guide 42 is disposed on the conveyance path PA. The second gas supply part 41 is disposed on an upper surface of the substrate conveyance guide 42. The substrate conveyance guide 42 extends along the conveyance path PA.

FIG. 9 is a perspective view showing the substrate conveyance guide 42. As shown in FIG. 9, the substrate conveyance guide 42 has a substantially square tube shape. The conveyance robot CR (FIG. 1) carries in or carries out the substrate W via an internal space 421 of the substrate conveyance guide 42. Therefore, the substrate W is conveyed through the internal space 421 of the substrate conveyance guide 42. That is, the conveyance path PA (FIG. 8) passes through the internal space 421 of the substrate conveyance guide 42.

The second gas supply part 41 has a substantially rectangular hollow parallelepiped shape. The second gas supply part 41 has the air feeding port part 41a. Specifically, a top plate part of the second gas supply part 41 functions as the air feeding port part 41a. The air feeding port part 41a has a plurality of ventilation holes 41b.

A distal end part of the piping P5 is inserted into the ventilation hole 41b. Therefore, when the valve V5 is opened, the second gas GA2 is supplied to the inside of the second gas supply part 41. Further, the second gas GA2 spurts upward in the vertical direction VD through the plurality of ventilation holes 41b. In this manner, the second gas supply part 41 supplies the second gas GA2 upward in the vertical direction VD through the plurality of ventilation holes 41b of the air feeding port part 41a.

The second gas supply part 41 may include a fan. In addition, the second gas supply part 41 shown in FIG. 9 can be employed as the second gas supply part 41 according to Embodiment 1 described with reference to FIG. 1. In addition, the shapes and the sizes of the ventilation holes 41b are not particularly limited as long as the second gas GA2 can pass through the ventilation holes 41b. The air feeding port part 41a may have one ventilation hole 41b.

As described above with reference to FIG. 9, the processing device 1A according to the modification example includes the substrate conveyance guide 42. Further, the second gas GA2 flows inside the chamber 3 and enters the substrate conveyance guide 42, and a gas including oxygen is discharged from the internal space 421 of the substrate conveyance guide 42. As a result, oxidation of the substrate W during conveyance of the substrate W can be curbed effectively.

Embodiment 2

With reference to FIGS. 10 to 14, a substrate processing device 100B according to Embodiment 2 of the disclosure will be described. Regarding Embodiment 2, Embodiment 2 mainly differs from Embodiment 1 in respect that the first gas supply part 13 can switch between the first gas GA1 and a fourth gas GA4. Hereinafter, differences between Embodiment 2 and Embodiment 1 will be mainly described.

Figure 10:
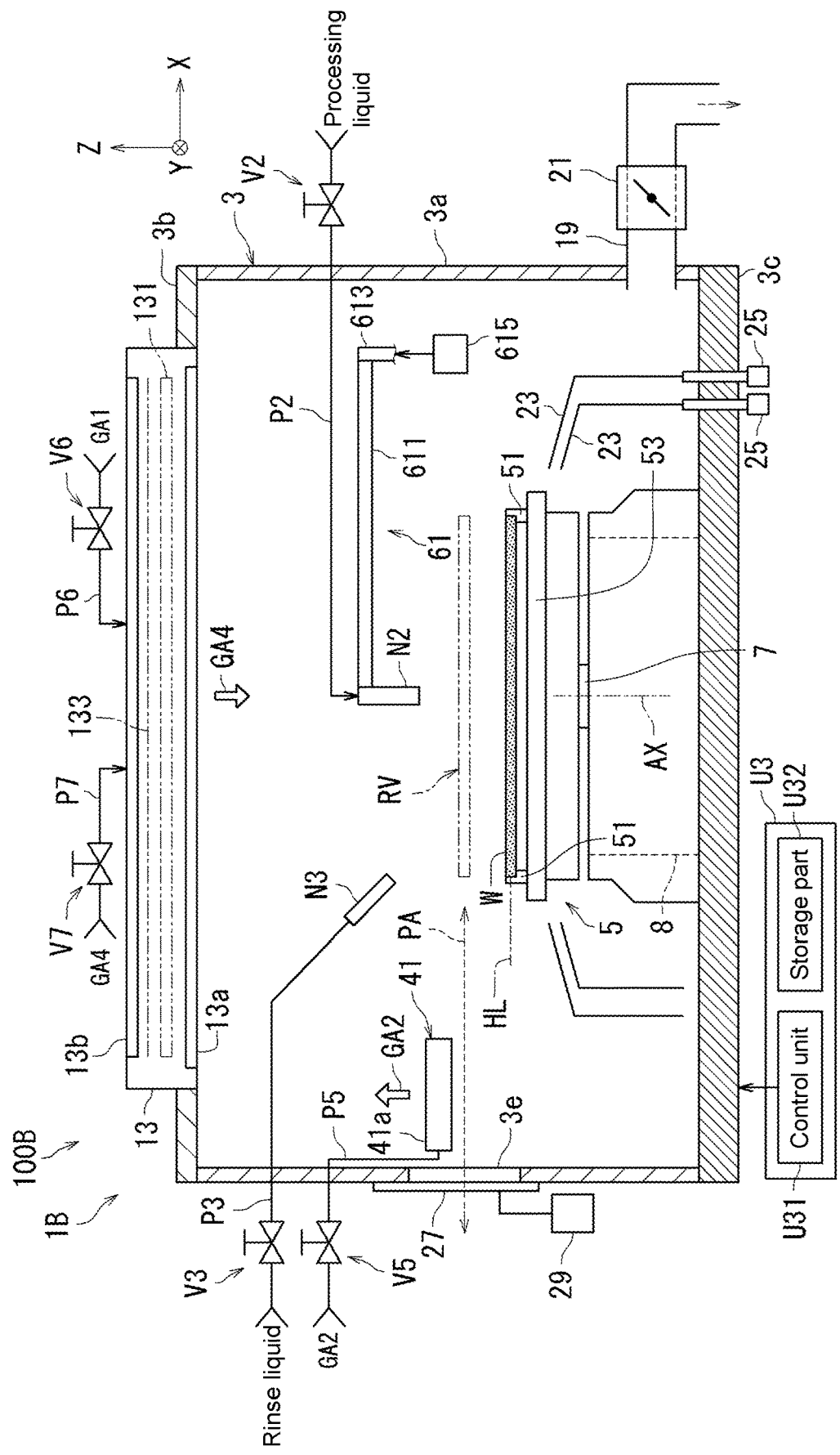
FIG. 10 is a schematic cross-sectional view showing a processing device included in a substrate processing device according to Embodiment 2 of the disclosure.

FIG. 10 is a schematic cross-sectional view showing a processing device 1B included in the substrate processing device 100B according to Embodiment 2. As shown in FIG. 10, the processing device 1B does not include the fluid supply unit 9, the unit elevating mechanism 11, the unit rotating mechanism 12, the opening/closing member 15, the member moving mechanism 17, the flow channel pipe 30, the piping P1, the piping P4, the valve V1, and the valve V4 of the substrate processing device 100 shown in FIG. 3.

The processing device 1B includes a movement part 61, a piping P6, a piping P7, a valve V6, and a valve V7. The movement part 61 moves the processing liquid supply part N2 between the processing position and the retreat position. The processing position indicates a position above the substrate W. The processing liquid supply part N2 supplies the processing liquid toward the substrate W when it is positioned at the processing position. The retreat position indicates a position on an outward side of the substrate W in the horizontal direction HD.

Specifically, the movement part 61 includes an arm 611, a turning shaft 613, and a movement mechanism 615. The arm 611 extends substantially in the horizontal direction HD. The processing liquid supply part N2 is attached to a distal end part of the arm 611. The arm 611 is coupled to the turning shaft 613. The turning shaft 613 extends substantially in the vertical direction VD. The movement mechanism 615 turns the turning shaft 613 around a turning axis substantially in the vertical direction VD and turns the arm 611 along a substantially horizontal surface. As a result, the processing liquid supply part N2 moves along the substantially horizontal surface. For example, the movement mechanism 615 includes an arm oscillation motor for turning the turning shaft 613 around the turning axis. For example, the arm oscillation motor is a servo motor. In addition, the movement mechanism 615 elevates the arm 611 by elevating the turning shaft 613 substantially in the vertical direction VD. As a result, the processing liquid supply part N2 moves substantially in the vertical direction VD. For example, the movement mechanism 615 includes a ball screw mechanism and an arm elevation motor for applying a driving force to the ball screw mechanism. For example, the arm elevation motor is a servo motor.

The first gas supply part 13 selectively supplies either the first gas GA1 or the fourth gas GA4 to inside of the chamber 3.

Specifically, the piping P6 supplies the first gas GA1 to the first gas supply part 13 through the suction port 13b. The valve V6 switches between start of supply and stopping of supply of the first gas GA1 with respect to the first gas supply part 13. When the valve V6 is opened, the first gas GA1 is supplied to the first gas supply part 13, and the first gas supply part 13 supplies the first gas GA1 to the inside of the chamber 3.

On the other hand, the piping P7 supplies a fourth gas G4 to the first gas supply part 13 through the suction port 13b. The valve V7 switches between start of supply and stopping of supply of the fourth gas GA4 with respect to the first gas supply part 13. When the valve V7 is opened, the fourth gas GA4 is supplied to the first gas supply part 13, and the first gas supply part 13 supplies the fourth gas GA4 to the inside of the chamber 3. The fourth gas GA4 is a gas different from oxygen and different from an allotrope of oxygen. For example, the fourth gas GA4 is an inert gas. For example, the inert gas is nitrogen. In Embodiment 2, the fourth gas GA4 is nitrogen.

The control unit U31 controls the first gas supply part 13 such that the first gas GA1 is supplied toward the side on which the spin chuck 5 is positioned during the substrate processing period T1. Therefore, the first gas supply part 13 supplies the first gas GA1. Furthermore, the control unit U31 controls the second gas supply part 41 such that the second gas GA2 is not supplied during the substrate processing period T1. Therefore, the second gas supply part 41 does not supply the second gas GA2. As a result, according to Embodiment 2, a downflow due to the first gas GA1 can be generated effectively inside the chamber 3 during the substrate processing period T1.

On the other hand, during at least one period T2 of the period T21 before a substrate is carried out and the period T22 before a substrate is carried in, the control unit U31 controls the second gas supply part 41 such that the second gas GA2 is supplied. Therefore, the second gas supply part 41 supplies the second gas GA2 to the inside of the chamber 3 through the air feeding port part 41a. As a result, similar to Embodiment 1, before and after the substrate W is processed, the oxygen concentration inside the chamber 3 can be decreased effectively, and therefore oxidation of the substrate W at the time of conveying the substrate W inside the chamber 3 can be curbed effectively. Furthermore, the constitution and the operation of the second gas supply part 41 are similar to the constitution and the operation of the second gas supply part 41 according to the foregoing embodiment or the modification example. Therefore, the substrate processing device 100B according to Embodiment 2 has effects similar to those in Embodiment 1.

In addition, during at least one period T2 of the period T21 before a substrate is carried out and the period T22 before a substrate is carried in, the control unit U31 controls the first gas supply part 13 such that the fourth gas GA4 is supplied toward the side on which the spin chuck 5 is positioned. Therefore, the first gas supply part 13 supplies the fourth gas GA4 downward in the vertical direction VD toward the side on which the spin chuck 5 is positioned. As a result, a gas including oxygen flows inside the chamber 3 due to the fourth gas GA4, moves toward the exhaust pipe 19, and is discharged. Thus, the oxygen concentration inside the chamber 3 is further decreased, and therefore oxidation of the substrate W at the time of conveying the substrate W inside the chamber 3 can be further curbed effectively.

Supplying of the second gas GA2 to the chamber 3 and supplying of the fourth gas GA4 to the chamber 3 may be executed at the same time or may be executed in time zones different from each other. For example, after the second gas GA2 is supplied to the chamber 3, supplying of the fourth gas GA4 to the chamber 3 is executed. For example, before the second gas GA2 is supplied to the chamber 3, supplying of the fourth gas GA4 to the chamber 3 is executed. In addition, execution times of supplying of the second gas GA2 and supplying of the fourth gas GA4 may partially overlap each other.

Figure 11:
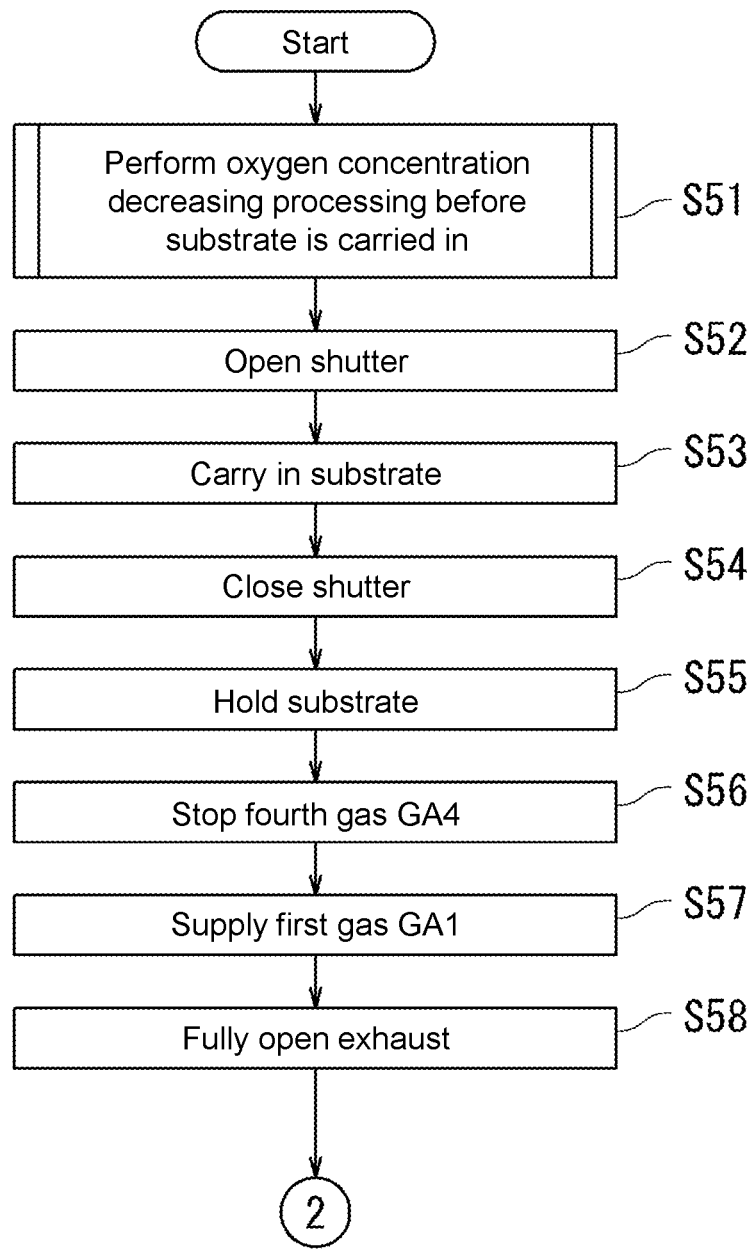
FIG. 11 is a flowchart showing a part of a substrate processing method according to Embodiment 2.
Figure 12:
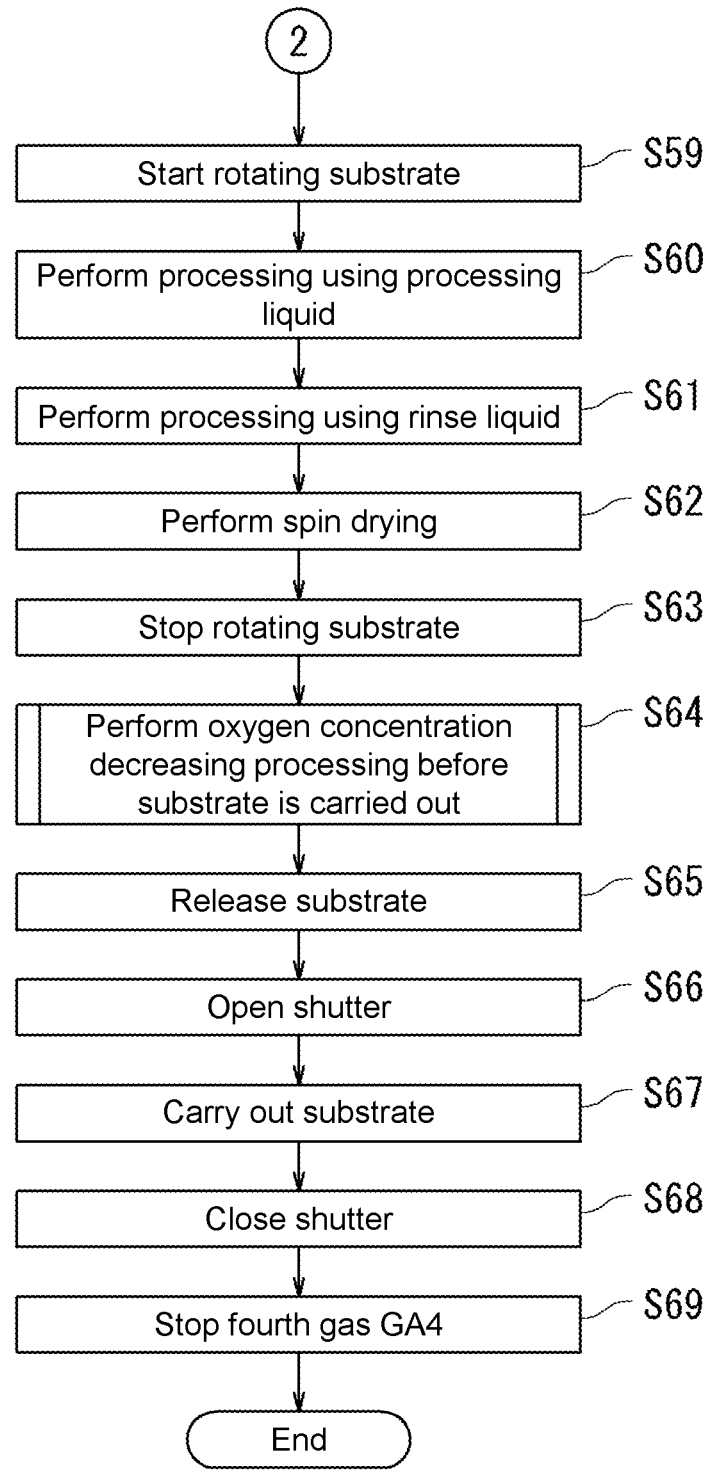
FIG. 12 is a flowchart showing another part of the substrate processing method according to Embodiment 2.
Figure 13:
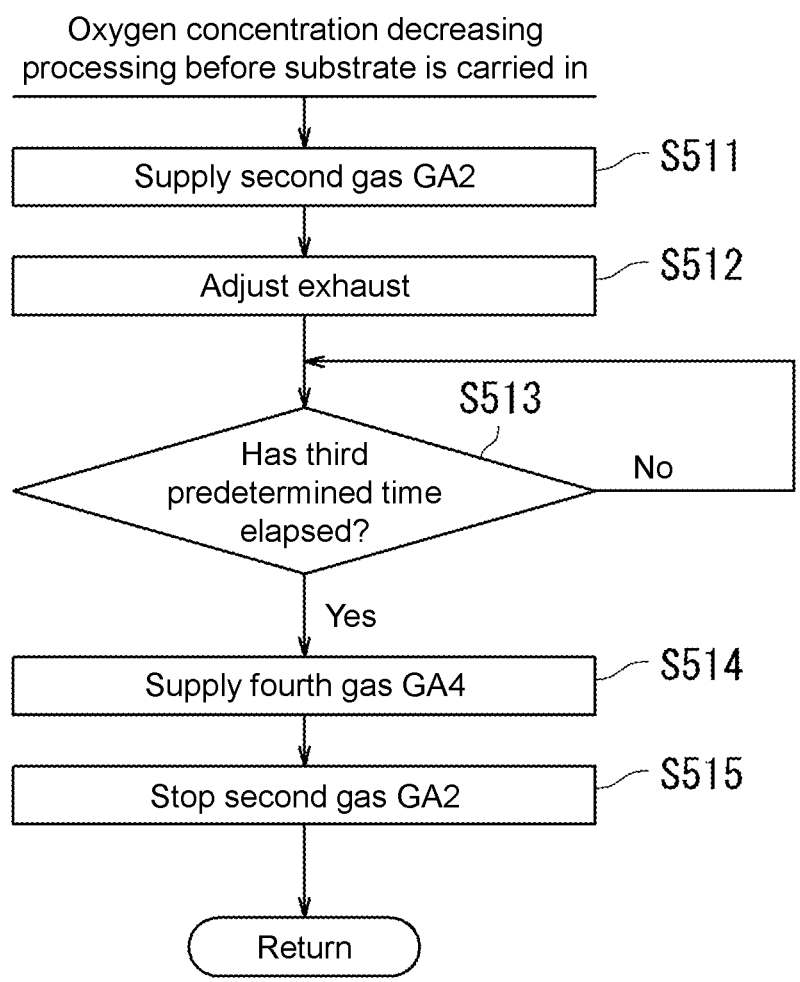
Figure 14:
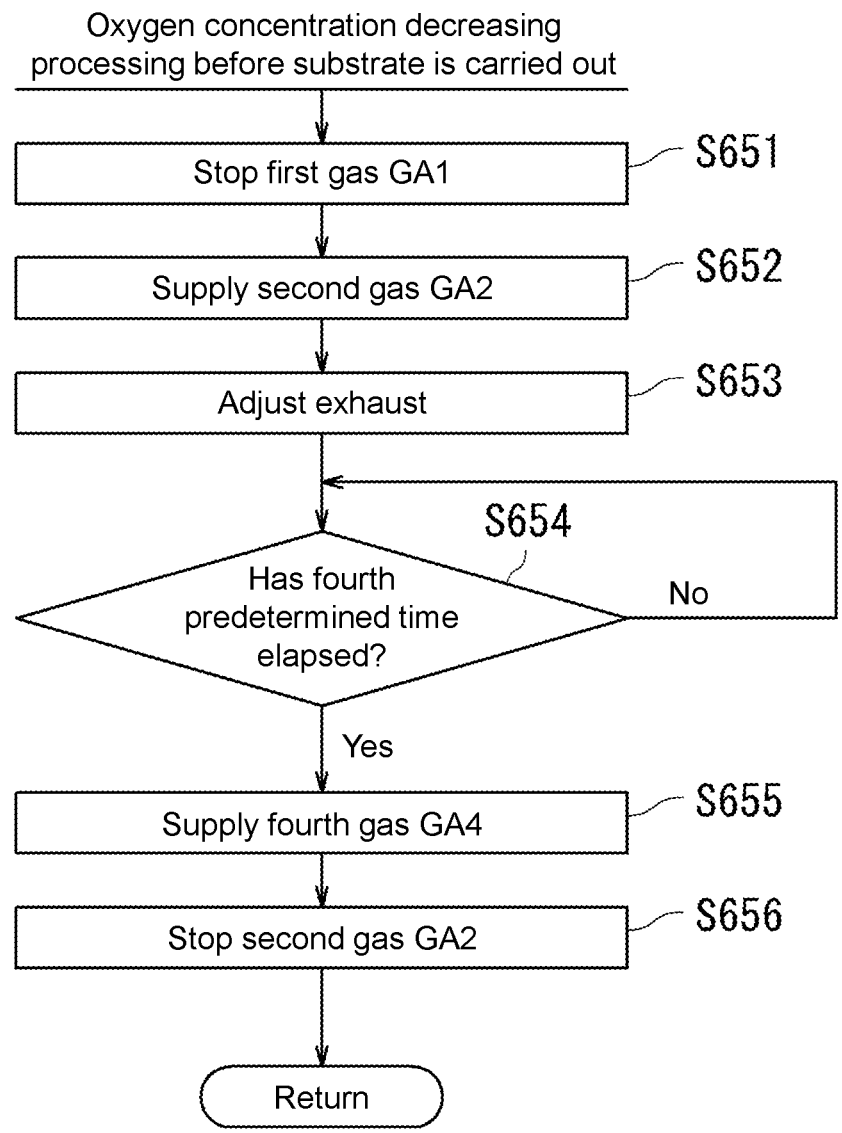
FIG. 14 is a flowchart showing oxygen concentration decreasing processing shown in FIG. 12 before a substrate is carried out.

Next, with reference to FIGS. 10 to 14, a substrate processing method according to Embodiment 2 will be described. The substrate processing method is executed by the substrate processing device 100B. In the substrate processing method, the substrate W held by the spin chuck 5 inside the chamber 3 is processed. FIGS. 11 and 12 are flowcharts showing the substrate processing method according to Embodiment 2. FIG. 13 is a flowchart showing Step S51 shown in FIG. 11. Step S51 shows oxygen concentration decreasing processing before the substrate W is carried in. FIG. 14 is a flowchart showing Step S64 shown in FIG. 12. Step S64 shows oxygen concentration decreasing processing before the substrate W is carried out.

As shown in FIGS. 11 and 12, the substrate processing method includes Steps S51 to S69.

As shown in FIGS. 10 and 11, in Step S51, the substrate processing device 100B executes the oxygen concentration decreasing processing before the substrate W is carried in. Before the substrate W is carried in, no substrate W is present inside the chamber 3 in FIG. 10.

Specifically, as shown in FIG. 13, the oxygen concentration decreasing processing before the substrate W is carried in includes Steps S511 to S515.

In Step S511, the control unit U31 controls the valve V5 such that the second gas supply part 41 supplies the second gas GA2. As a result, the second gas supply part 41 supplies the second gas GA2 toward the inside of the chamber 3. Specifically, Step S511 is similar to Step S102 shown in FIG. 6.

Next, in Step S512, the control unit U31 controls the exhaust adjustment part 21 and adjusts the flow rate of a gas in the exhaust pipe 19 such that it becomes lower than the flow rate of a gas during the substrate processing period T1. Specifically, Step S512 is similar to Step S105 shown in FIG. 6.

Next, in Step S513, the control unit U31 determines whether or not a third predetermined time has elapsed from the starting time of Step S511. The third predetermined time indicates a time required for the oxygen concentration inside the chamber 3 to have a predetermined value or smaller. For example, a predetermined value is 100 ppm.

When it is determined in Step S513 that the third predetermined time has not elapsed (No in Step S513), the processing repeats Step S513 until it is determined in Step S513 that the third predetermined time has elapsed.

On the other hand, when it is determined in Step S513 that the third predetermined time has elapsed (Yes in Step S513), the processing proceeds to Step S514.

In Step S514, the control unit U31 controls the first gas supply part 13 such that the first gas supply part 13 supplies the fourth gas GA4. As a result, the first gas supply part 13 supplies the fourth gas GA4 toward the side on which the spin chuck 5 is positioned.

Specifically, in Step S514, the fourth gas GA4 is supplied by the first gas supply part 13 from the top wall part 3b of the chamber 3 toward the side on which the spin chuck 5 surrounded by the side wall part 3a of the chamber 3 is positioned. Particularly, in accordance with execution of Step S514, the fourth gas GA4 is supplied during the period T22 before a substrate is carried in.

Unless the control unit U31 controls the first gas supply part 13 to stop supplying of the fourth gas GA4, the first gas supply part 13 continues to supply the fourth gas GA4.

Next, in Step S515, the control unit U31 controls the valve V5 such that the second gas supply part 41 stops supplying of the second gas GA2. As a result, the second gas supply part 41 stops supplying of the second gas GA2. Further, the processing ends the oxygen concentration decreasing processing before the substrate W is carried in and returns to the main routine shown in FIG. 11. Specifically, the processing proceeds to Step S52 shown in FIG. 11.

Steps S52 to S55 shown in FIG. 11 are similar to respective Steps S2 to S5 shown in FIG. 4, and therefore description thereof will be omitted. After Step S55, the processing proceeds to Step S56.

In Step S56, the control unit U31 controls the first gas supply part 13 such that the first gas supply part 13 stops supplying of the fourth gas GA4. As a result, the first gas supply part 13 stops supplying of the fourth gas GA4. After Step S56, the processing proceeds to Step S57.

Steps S57 and S58 are similar to Steps S9 and S10 shown in FIG. 4, and therefore description thereof will be omitted. After Step S58, the processing proceeds to Step S59 shown in FIG. 12.

Steps S59 to S63 shown in FIG. 12 are similar to respective Steps S11 to S15 shown in FIG. 5, and therefore description thereof will be omitted. After Step S63, the processing proceeds to Step S64.

In Step S64, the substrate processing device 100B executes the oxygen concentration decreasing processing before the substrate W is carried out.

As shown in FIG. 14, the oxygen concentration decreasing processing before the substrate W is carried out includes Steps S651 to S656.

In Step S651, the control unit U31 controls the first gas supply part 13 such that the first gas supply part 13 stops supplying of the first gas GA1. As a result, the first gas supply part 13 stops supplying of the first gas GA1.

Next, in Step S652, the control unit U31 controls the valve V5 such that the second gas supply part 41 supplies the second gas GA2. As a result, the second gas supply part 41 supplies the second gas GA2 toward the inside of the chamber 3. Furthermore, Step S652 is similar to Step S511 in FIG. 13. However, in Step S652, the second gas supply part 41 supplies the second gas GA2 during the period T21 before a substrate is carried out.

Next, in Step S653, the control unit U31 controls the exhaust adjustment part 21 and adjusts the flow rate of a gas in the exhaust pipe 19 such that it becomes lower than the flow rate of a gas during the substrate processing period T1. Specifically, Step S653 is similar to Step S512 shown in FIG. 13.

Next, in Step S654, the control unit U31 determines whether or not a fourth predetermined time has elapsed from the starting time of Step S651. The fourth predetermined time indicates a time required for the oxygen concentration inside the chamber 3 to have a predetermined value or smaller. For example, a predetermined value is 100 ppm.

When it is determined in Step S654 that the fourth predetermined time has not elapsed (No in Step S654), the processing repeats Step S654 until it is determined in Step S654 that the fourth predetermined time has elapsed.

On the other hand, when it is determined in Step S654 that the fourth predetermined time has elapsed (Yes in Step S654), the processing proceeds to Step S655.

In Step S655, the control unit U31 controls the first gas supply part 13 such that the first gas supply part 13 supplies the fourth gas GA4. As a result, the first gas supply part 13 supplies the fourth gas GA4 toward the side on which the spin chuck 5 is positioned. Furthermore, Step S655 is similar to Step S514 in FIG. 13. However, in accordance with execution of Step S655, the fourth gas GA4 is supplied during the period T21 before a substrate is carried out.

Next, in Step S656, the control unit U31 controls the valve V5 such that the second gas supply part 41 stops supplying of the second gas GA2. As a result, the second gas supply part 41 stops supplying of the second gas GA2. Further, the processing ends the oxygen concentration decreasing processing before the substrate W is carried in and returns to the main routine shown in FIG. 12. Specifically, the processing proceeds to Step S65 shown in FIG. 12.

Steps S65 to S68 shown in FIG. 12 are similar to respective Steps S17 to S20 shown in FIG. 5, and therefore description thereof will be omitted. After Step S68, the processing proceeds to Step S69.

In Step S69, the control unit U31 controls the first gas supply part 13 such that the first gas supply part 13 stops supplying of the fourth gas GA4. As a result, the first gas supply part 13 stops supplying of the fourth gas GA4. Further, the processing by the substrate processing method ends.

As described above with reference to FIGS. 11 to 14, according to Embodiment 2, during the period T22 before a substrate is carried in and the period T21 before a substrate is carried out, the second gas supply part 41 supplies the second gas GA2 to the inside of the chamber 3 through the air feeding port part 41a (Steps S511 and S652). Furthermore, during the period T22 before a substrate is carried in and the period T21 before a substrate is carried out, the first gas supply part 13 supplies the fourth gas GA4 to the inside of the chamber 3 (Steps S514 and S655). Therefore, according to Embodiment 2, a gas including oxygen flows inside the chamber 3 due to the second gas GA2 and the fourth gas GA4, moves toward the exhaust pipe 19, and is discharged. As a result, before and after the substrate W is processed, the oxygen concentration inside the chamber 3 can be decreased effectively, and therefore oxidation of the substrate W at the time of conveying the substrate W inside the chamber 3 can be curbed effectively.

Particularly, in Embodiment 2, first, the second gas GA2 is stopped after the oxygen concentration inside the chamber 3 is rapidly decreased due to the second gas GA2 from the second gas supply part 41, and a state where the oxygen concentration inside the chamber 3 is decreased due to the fourth gas GA4 from the first gas supply part 13 is maintained. That is, the second gas supply part 41 and the first gas supply part 13 share roles when the oxygen concentration inside the chamber 3 is decreased, so that the oxygen concentration inside the chamber 3 can be decreased efficiently.

In addition, the substrate processing method according to Embodiment 2 can be utilized in the semiconductor manufacturing method. That is, in the semiconductor manufacturing method according to Embodiment 2, the semiconductor substrate W held by the spin chuck 5 inside the chamber 3 is processed by the substrate processing method including Steps S51 to S69, and a semiconductor that is a processed semiconductor substrate W is manufactured.

The substrate processing method need only include at least one step of Steps S51 and Step S64. Moreover, Steps S512 and S653 are preferable examples, and the substrate processing method does not have to include Steps S512 and S653. In the flowcharts shown in FIGS. 11 to 14, the sequential order of the steps can be changed suitably within a range not departing from the gist of the disclosure.

In addition, in the second gas supply mode of Embodiment 1 (including the modification example) and Embodiment 2, for the purpose of causing the second gas GA2 supplied upward from the second gas supply part 41 to flow more preferably along the top wall part 3b and the side wall part 3a, a straightening plate may be provided in a connection part between the top wall part 3b and the side wall part 3a. In addition, the connection part between the top wall part 3b and the side wall part 3a may be rounded such that a space between the top wall part 3b and the side wall part 3a does not become a drift of residual oxygen.

A substrate processing device performs processing of a substrate is provided. The substrate processing device includes a substrate holding part, a chamber, a first gas supply part, a second gas supply part, and a control unit. The substrate holding part holds the substrate. The chamber has a side wall part disposed around the substrate holding part and a top wall part disposed above the substrate holding part and contains the substrate holding part. The first gas supply part is disposed in the top wall part and supplies a first gas toward a side on which the substrate holding part is positioned. The second gas supply part is contained in the chamber and supplies a second gas to an inside of the chamber. The control unit controls the first gas supply part and the second gas supply part. The second gas is a gas different from oxygen and different from an allotrope of oxygen. The second gas supply part has an air feeding port part for supplying the second gas to the inside of the chamber. The air feeding port part is positioned on an upward side of a holding position of the substrate by the substrate holding part in a vertical direction and is positioned on an outward side of the substrate holding part in a horizontal direction.

In the substrate processing device of the disclosure, it is preferable that the second gas supply part supply the second gas toward the top wall part through the air feeding port part.

In the substrate processing device of the disclosure, it is preferable that the air feeding port part be disposed above a conveyance path for the substrate. It is preferable that the conveyance path indicate a path at a time of conveying the substrate via an opening which is provided in the side wall part and is able to be opened and closed.

In the substrate processing device of the disclosure, it is preferable that the control unit control the first gas supply part such that the first gas is supplied and control the second gas supply part such that the second gas is not supplied during a period of processing the substrate. It is preferable that the control unit control the first gas supply part such that the first gas is not supplied and control the second gas supply part such that the second gas is supplied during at least one period of a period after the substrate is processed and before the substrate is carried out from the chamber and a period before the substrate is carried into the chamber.

In the substrate processing device of the disclosure, it is preferable that the first gas supply part have a suction port for suctioning the first gas from outside of the chamber, and a supply port for supplying the first gas toward the side on which the substrate holding part is positioned. It is preferable that the substrate processing device further include an opening/closing member that releases or closes the suction port. It is preferable that the control unit control the opening/closing member such that the suction port is released during the period of processing the substrate. It is preferable that the control unit control the opening/closing member such that the suction port is closed during at least the one period thereof.

It is preferable that the substrate processing device of the disclosure further include a blocking member and a third gas supply part. It is preferable that the blocking member be positioned above the substrate holding part and move upward or downward between a retreat position and a processing position. It is preferable that the third gas supply part be disposed in the blocking member and supply a third gas downward from the blocking member. It is preferable that the third gas be a gas different from oxygen and different from an allotrope of oxygen. It is preferable that the processing position indicate a position to which the blocking member moves downward to be disposed facing a surface of the substrate with a gap therebetween. It is preferable that the retreat position indicate a position to which the blocking member moves upward to separate from the surface of the substrate. It is preferable that the control unit control the blocking member such that the blocking member is positioned at the retreat position and control the third gas supply part such that the third gas is supplied during at least the one period thereof.

In the substrate processing device of the disclosure, it is preferable that the control unit control the blocking member such that the blocking member is positioned at the processing position and control the third gas supply part such that the third gas is supplied during the period of processing the substrate. It is preferable that the blocking member cover a side above the surface of the substrate and block the side above the surface of the substrate at the processing position.

In the substrate processing device of the disclosure, it is preferable that the first gas supply part selectively supply either the first gas or a fourth gas. It is preferable that the fourth gas be a gas different from oxygen and different from an allotrope of oxygen. It is preferable that the control unit control the first gas supply part such that the first gas is supplied and control the second gas supply part such that the second gas is not supplied during a period of processing the substrate. It is preferable that the control unit control the first gas supply part such that the fourth gas is supplied toward the side on which the substrate holding part is positioned and control the second gas supply part such that the second gas is supplied during at least one period of a period after the substrate is processed and before the substrate is carried out from the chamber and a period before the substrate is carried into the chamber.

It is preferable that the substrate processing device of the disclosure further include an exhaust pipe and an exhaust adjustment part. It is preferable that the exhaust pipe be disposed on a downward side of the substrate holding part in the vertical direction and allow a gas inside the chamber to pass therethrough. It is preferable that the exhaust adjustment part adjust a flow rate of the gas discharged through the exhaust pipe. It is preferable that the control unit control the exhaust adjustment part such that the gas is discharged through the exhaust pipe during the period of processing the substrate. It is preferable that the control unit control the exhaust adjustment part such that the flow rate of the gas becomes lower in the exhaust pipe during at least the one period thereof than the flow rate of the gas in the exhaust pipe during the period of processing the substrate.

According to another aspect of the disclosure, there is provided a substrate processing method in which a substrate held by a substrate holding part inside a chamber is processed. The substrate processing method includes a step of supplying a first gas from a top wall part of the chamber toward a side on which the substrate holding part surrounded by a side wall part of the chamber is positioned, and a step of supplying a second gas to an inside of the chamber during a period different from a period of executing the step of supplying the first gas. The second gas is a gas different from oxygen and different from an allotrope of oxygen. In the step of supplying the second gas, the second gas is supplied from a position on an upward side of a holding position of the substrate by the substrate holding part in a vertical direction and a position on an outward side of the substrate holding part in a horizontal direction.

In the substrate processing method of the disclosure, it is preferable that in the step of supplying the second gas, the second gas be supplied toward the top wall part.

In the substrate processing method of the disclosure, it is preferable that in the step of supplying the second gas, the second gas be supplied from a position above a conveyance path for the substrate. It is preferable that the conveyance path indicate a path at a time of conveying the substrate via an opening which is provided in the side wall part and is able to be opened and closed.

In the substrate processing method of the disclosure, it is preferable that in the step of supplying the first gas, the first gas be supplied during a period of processing the substrate. It is preferable that the second gas be not supplied during the period of processing the substrate. It is preferable that in the step of supplying the second gas, the second gas be supplied during at least one period of a period after the substrate is processed and before the substrate is carried out from the chamber and a period before the substrate is carried into the chamber. It is preferable that the first gas be not supplied during at least the one period thereof.

It is preferable that the substrate processing method of the disclosure further include a step of releasing a suction port for suctioning the first gas from outside of the chamber during the period of processing the substrate, and a step of closing the suction port during at least the one period thereof.

It is preferable that the substrate processing method of the disclosure further include a step of positioning a blocking member at a retreat position during at least the one period thereof, and a step of supplying a third gas downward from the blocking member during at least the one period thereof. It is preferable that the retreat position indicate a position to which the blocking member moves upward to separate from a surface of the substrate. It is preferable that the third gas be a gas different from oxygen and different from an allotrope of oxygen.

It is preferable that the substrate processing method of the disclosure further include a step of positioning the blocking member at a processing position during the period of processing the substrate, and a step of supplying the third gas downward from the blocking member during the period of processing the substrate. It is preferable that the processing position indicate a position to which the blocking member moves downward to be disposed facing the surface of the substrate with a gap therebetween. It is preferable that the blocking member cover a side above the surface of the substrate and block the side above the surface of the substrate at the processing position.

In the substrate processing method of the disclosure, it is preferable that in the step of supplying the first gas, the first gas be supplied from the top wall part of the chamber toward the side on which the substrate holding part is positioned during a period of processing the substrate. It is preferable that the second gas be not supplied during the period of processing the substrate. It is preferable that in the step of supplying the second gas, the second gas be supplied during at least one period of a period after the substrate is processed and before the substrate is carried out from the chamber and a period before the substrate is carried into the chamber. It is preferable that the substrate processing method further include a step of supplying a fourth gas from the top wall part of the chamber toward the side on which the substrate holding part is positioned during at least the one period thereof. It is preferable that the fourth gas be a gas different from oxygen and different from an allotrope of oxygen.

It is preferable that the substrate processing method of the disclosure further include a step of discharging a gas inside the chamber from an exhaust pipe which is disposed on a downward side of the substrate holding part in the vertical direction during the period of processing the substrate, and a step of adjusting a flow rate of the gas such that the flow rate of the gas becomes lower in the exhaust pipe during at least the one period thereof than the flow rate of the gas in the exhaust pipe during the period of processing the substrate.

According to still another aspect of the disclosure, there is provided a semiconductor manufacturing method in which a semiconductor substrate held by a substrate holding part inside a chamber is processed and a semiconductor that is the processed semiconductor substrate is manufactured. The semiconductor manufacturing method includes a step of supplying a first gas from a top wall part of the chamber toward a side on which the substrate holding part surrounded by a side wall part of the chamber is positioned, and a step of supplying a second gas to an inside of the chamber during a period different from a period of executing the step of supplying the first gas. The second gas is a gas different from oxygen and different from an allotrope of oxygen. In the step of supplying the second gas, the second gas is supplied from a position on an upward side of a holding position of the semiconductor substrate by the substrate holding part in a vertical direction and a position on an outward side of the substrate holding part in a horizontal direction.

Hereinabove, embodiments of the disclosure have been described with reference to the drawings. However, the disclosure is not limited to the foregoing embodiments and can be performed in various forms within a range not departing from the gist thereof. In addition, a plurality of constituent elements disclosed in the foregoing embodiments can be modified and changed suitably. For example, a certain constituent element of all the constituent elements shown in a certain embodiment may be added to a constituent element of another embodiment, or some constituent elements of all the constituent elements shown in a certain embodiment may be deleted from the embodiments.

In addition, in order to make the disclosure easy to understand, the drawings schematically show each of the constituent elements as a main constituent. For the sake of making the drawings easy to understand, there are cases where actually shown constituent elements may differ from respective constituent elements in thickness, length, number, gap, and the like. In addition, the constitution of each of the constituent elements shown in the foregoing embodiments is an example and is not particularly limited. It goes without saying that various changes can be made within a range not departing practically from the effects of the disclosure.

What is claimed is:

1. A substrate processing device for processing a substrate, comprising:
   a substrate holding part that holds the substrate;
   a chamber that has a side wall part disposed around the substrate holding part and a top wall part disposed above the substrate holding part and contains the substrate holding part;
   a first gas supply part that is disposed in the top wall part and supplies a first gas toward a side on which the substrate holding part is positioned;
   a second gas supply part that is contained in the chamber and supplies a second gas to an inside of the chamber; and
   a control unit that is configured to control the first gas supply part and the second gas supply part,
   wherein the second gas is a gas different from oxygen and different from an allotrope of oxygen, wherein the second gas supply part has an air feeding port part for supplying the second gas to the inside of the chamber,
   wherein the air feeding port part is positioned on an upward side of a holding position of the substrate by the substrate holding part in a vertical direction and is positioned on an outward side of the substrate holding part in a horizontal direction, and wherein the second gas supply part supplies the second gas toward the top wall part through the air feeding port part.

2. The substrate processing device according to claim 1, wherein the air feeding port part is disposed above a conveyance path for the substrate, and wherein the conveyance path indicates a path at a time of conveying the substrate via an opening which is provided in the side wall part and is able to be opened and closed.

3. The substrate processing device according to claim 1, wherein the control unit is configured to:

control the first gas supply part such that the first gas is supplied and control the second gas supply part such that the second gas is not supplied during a period of processing the substrate, and control the first gas supply part such that the first gas is not supplied and control the second gas supply part such that the second gas is supplied during at least one period of a period after the substrate is processed and before the substrate is carried out from the chamber and a period before the substrate is carried into the chamber.

4. The substrate processing device according to claim 3, wherein the first gas supply part has a suction port for suctioning the first gas from outside of the chamber, and a supply port for supplying the first gas toward the side on which the substrate holding part is positioned, wherein the substrate processing device further comprises an opening/closing member that releases or closes the suction port, and wherein the control unit is configured to:

control the opening/closing member such that the suction port is released during the period of processing the substrate, and control the opening/closing member such that the suction port is closed during at least the one period thereof.

5. The substrate processing device according to claim 3, further comprising:

a blocking member that is positioned above the substrate holding part and moves upward or downward between a retreat position and a processing position; and a third gas supply part that is disposed in the blocking member and supplies a third gas downward from the blocking member, wherein the third gas is a gas different from oxygen and different from an allotrope of oxygen, wherein the processing position indicates a position to which the blocking member moves downward to be disposed facing a surface of the substrate with a gap therebetween, wherein the retreat position indicates a position to which the blocking member moves upward to separate from the surface of the substrate, and wherein the control unit is configured to control the blocking member such that the blocking member is positioned at the retreat position and control the third gas supply part such that the third gas is supplied during at least the one period thereof.

6. The substrate processing device according to claim 5, wherein the control unit is configured to control the blocking member such that the blocking member is positioned at the processing position and control the third gas supply part such that the third gas is supplied during the period of processing the substrate, and wherein the blocking member covers a side above the surface of the substrate and blocks the side above the surface of the substrate at the processing position.

7. The substrate processing device according to claim 1, wherein the first gas supply part selectively supplies either the first gas or a fourth gas, wherein the fourth gas is a gas different from oxygen and different from an allotrope of oxygen, and wherein the control unit is configured to:

control the first gas supply part such that the first gas is supplied and controls the second gas supply part such that the second gas is not supplied during a period of processing the substrate, and control the first gas supply part such that the fourth gas is supplied toward the side on which the substrate holding part is positioned and control the second gas supply part such that the second gas is supplied during at least one period of a period after the substrate is processed and before the substrate is carried out from the chamber and a period before the substrate is carried into the chamber.

8. The substrate processing device according to claim 3, further comprising:

an exhaust pipe that is disposed on a downward side of the substrate holding part in the vertical direction and allows a gas inside the chamber to pass therethrough; and an exhaust adjustment part that adjusts a flow rate of the gas discharged through the exhaust pipe, wherein the control unit is configured to:

control the exhaust adjustment part such that the gas is discharged through the exhaust pipe during the period of processing the substrate, and control the exhaust adjustment part such that the flow rate of the gas becomes lower in the exhaust pipe during at least the one period thereof than the flow rate of the gas in the exhaust pipe during the period of processing the substrate.

9. A substrate processing method for processing a substrate which is held by a substrate holding part inside a chamber, comprising:

supplying a first gas from a top wall part of the chamber toward a side on which the substrate holding part surrounded by a side wall part of the chamber is positioned; and supplying a second gas to an inside of the chamber during a period different from a period of supplying the first gas, wherein the second gas is a gas different from oxygen and different from an allotrope of oxygen, wherein in supplying the second gas, the second gas is supplied from a position on an upward side of a holding position of the substrate by the substrate holding part in a vertical direction and a position on an outward side of the substrate holding part in a horizontal direction, and wherein in supplying the second gas, the second gas is supplied from a position above a conveyance path for the substrate, and wherein the conveyance path indicates a path at a time of conveying the substrate via an opening which is provided in the side wall part and is able to be opened and closed.

10. The substrate processing method according to claim 9, wherein in supplying the second gas, the second gas is supplied toward the top wall part.

11. The substrate processing method according to claim 9, wherein in supplying the first gas, the first gas is supplied during a period of processing the substrate, and the second gas is not supplied during the period of processing the substrate; and wherein in supplying the second gas, the second gas is supplied during at least one period of a period after the substrate is processed and before the substrate is carried out from the chamber and a period before the substrate is carried into the chamber, and the first gas is not supplied during at least the one period thereof.

12. The substrate processing method according to claim 11, further comprising:

releasing a suction port for suctioning the first gas from outside of the chamber during the period of processing the substrate; and closing the suction port during at least the one period thereof.

13. The substrate processing method according to claim 11, further comprising:

positioning a blocking member at a retreat position during at least the one period thereof; and supplying a third gas downward from the blocking member during at least the one period thereof, wherein the retreat position indicates a position to which the blocking member moves upward to separate from a surface of the substrate, and wherein the third gas is a gas different from oxygen and different from an allotrope of oxygen.

14. The substrate processing method according to claim 13, further comprising:

positioning the blocking member at a processing position during the period of processing the substrate; and supplying the third gas downward from the blocking member during the period of processing the substrate, wherein the processing position indicates a position to which the blocking member moves downward to be disposed facing the surface of the substrate with a gap therebetween, and wherein the blocking member covers a side above the surface of the substrate and blocks the side above the surface of the substrate at the processing position.

15. The substrate processing method according to claim 10, wherein in supplying the first gas, the first gas is supplied from the top wall part of the chamber toward the side on which the substrate holding part is positioned during a period of processing the substrate, and the second gas is not supplied during the period of processing the substrate;

wherein in supplying the second gas, the second gas is supplied during at least one period of a period after the substrate is processed and before the substrate is carried out from the chamber and a period before the substrate is carried into the chamber;

wherein the substrate processing method further comprises supplying a fourth gas from the top wall part of the chamber toward the side on which the substrate holding part is positioned during at least the one period thereof; and wherein the fourth gas is a gas different from oxygen and different from an allotrope of oxygen.

16. The substrate processing method according to claim 11, further comprising:

discharging a gas inside the chamber from an exhaust pipe which is disposed on a downward side of the substrate holding part in the vertical direction during the period of processing the substrate; and adjusting a flow rate of the gas such that the flow rate of the gas becomes lower in the exhaust pipe during at least the one period thereof than the flow rate of the gas in the exhaust pipe during the period of processing the substrate.

* * * * *